United States Patent
Chen

(10) Patent No.: US 11,630,396 B2
(45) Date of Patent: Apr. 18, 2023

(54) MODEL CALIBRATION AND GUIDED METROLOGY BASED ON SMART SAMPLING

(71) Applicant: ASML NETHERLANDS B.V., Veldhoven (NL)

(72) Inventor: Jun Chen, San Jose, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 17/261,293

(22) PCT Filed: Jul. 24, 2019

(86) PCT No.: PCT/EP2019/069858
§ 371 (c)(1),
(2) Date: Jan. 19, 2021

(87) PCT Pub. No.: WO2020/035272
PCT Pub. Date: Feb. 20, 2020

(65) Prior Publication Data
US 2021/0263428 A1    Aug. 26, 2021

Related U.S. Application Data

(60) Provisional application No. 62/718,504, filed on Aug. 14, 2018.

(51) Int. Cl.
*G03F 7/20*    (2006.01)
*H01J 37/28*   (2006.01)
*H01L 21/66*   (2006.01)

(52) U.S. Cl.
CPC .......... *G03F 7/70633* (2013.01); *G03F 7/705* (2013.01); *G03F 7/70525* (2013.01);
(Continued)

(58) Field of Classification Search
CPC .. G03F 7/705; G03F 7/70633; G03F 7/70625; G03F 7/70641; G03F 7/70516; G03F 7/70441
See application file for complete search history.

(56) References Cited

U.S. PATENT DOCUMENTS 6,961,116 B2    11/2005    Den Boef et al.
8,694,928 B2     4/2014    Cao et al.
(Continued)

FOREIGN PATENT DOCUMENTS

| CN | 106873315 | 6/2017 |
| WO | 2017144379 | 8/2017 |
| WO | 2018077651 | 5/2018 |

OTHER PUBLICATIONS

International Search Report and Written Opinion issued in corresponding PCT Patent Application No. PCT/EP2019/069858, dated Nov. 12, 2019.

*Primary Examiner* — Steven Whitesell Gordon
(74) *Attorney, Agent, or Firm* — Pillsbury Winthrop Shaw Pittman LLP

(57) ABSTRACT

A method for calibrating a process model of a patterning process. The method includes identifying a portion of the substrate that has values within a tolerance band of one or more parameters (e.g., CD, EPE, etc.) of the patterning process, obtaining, via a metrology tool, metrology data corresponding to the portion of the substrate, processing the metrology data, and calibrating a process model based on the processed metrology data.

20 Claims, 17 Drawing Sheets

(52) U.S. Cl.
CPC ...... *G03F 7/70616* (2013.01); *G03F 7/70641* (2013.01); *H01J 37/28* (2013.01); *H01L 22/12* (2013.01); *H01J 2237/2817* (2013.01)

(56) References Cited

U.S. PATENT DOCUMENTS

| | | |
|---|---|---|
| 2006/0066855 A1 | 3/2006 | Boef et al. |
| 2008/0077352 A1 | 3/2008 | Willis et al. |
| 2009/0249261 A1* | 10/2009 | Kim .......... G03F 1/36 716/132 |
| 2010/0122225 A1 | 5/2010 | Cao et al. |
| 2011/0185324 A1 | 7/2011 | Huang et al. |
| 2014/0075398 A1* | 3/2014 | Isoyan ........ G03F 7/70625 716/53 |
| 2015/0058814 A1 | 2/2015 | Cai |
| 2015/0168851 A1* | 6/2015 | Li .......... G03F 7/70616 355/55 |
| 2016/0161840 A1* | 6/2016 | Lim .......... G03F 1/36 355/55 |
| 2016/0161841 A1 | 6/2016 | Weisbuch |
| 2016/0290796 A1 | 10/2016 | Levy et al. |
| 2017/0242425 A1* | 8/2017 | Buhl ......... G05B 19/4188 |

* cited by examiner

MODEL CALIBRATION AND GUIDED METROLOGY BASED ON SMART SAMPLING

CROSS-REFERENCE TO RELATED APPLICATIONS

This application is the U.S. national phase entry of PCT Patent Application No. PCT/EP2019/069858, which was filed on Jul. 24, 2019, which claims the benefit of priority of U.S. Patent Application No. 62/718,504, which was filed on Aug. 14, 2018, and which is incorporated herein in its entirety by reference.

TECHNICAL FIELD

The description herein relates generally to a patterning process and a metrology apparatus. More particularly, an apparatus or a method for smartly sampling metrology data on a substrate.

BACKGROUND

A lithography apparatus is a machine that applies a desired pattern onto a target portion of a substrate. Lithography apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithography apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching the pattern using an etch apparatus, etc.

SUMMARY

According to an embodiment, there is provided a method for calibrating a process model of a patterning process. The method includes identifying, via a processor, a portion of the substrate that has values within a tolerance band of one or more parameters of the patterning process; obtaining, via a metrology tool, metrology data corresponding to the portion of the substrate; processing, via the processor, the metrology data; and calibrating, via the processor, a process model based on the processed metrology data.

In an embodiment, the identifying step further includes obtaining a plurality of process variations, and a combined process variation of the plurality of process variations; and identifying the portion of the substrate that has values within the tolerance band of one or more parameters of the patterning process based the combined process variation.

In an embodiment, a process variation of the plurality of the process variations or the combined process variation is a map of the substrate, wherein the map is a distribution of values of a process variable across the substrate.

In an embodiment, the plurality of process variation maps comprises a dose map, a focus map, a CD map, an overlay map, and/or an edge placement error map.

In an embodiment, the obtaining the metrology data includes guiding, via the processor, the metrology tool to the portion of the substrate; and sampling, via the metrology tool, data at the portion of the substrate.

In an embodiment, the metrology data comprises an image of a printed substrate, and/or values of a parameter of the patterning process.

In an embodiment, the parameter of the patterning process is a critical dimension, an edge placement error, and/or an overlay.

In an embodiment, the metrology data is a scanning electron microscope image.

In an embodiment, the process model is an optical proximity correction model.

In an embodiment, the portion of the substrate has least systematic variations within the combined map.

In an embodiment, the processing the metrology data includes at least one of image processing, determining an average of the metrology data of the portion of the substrate, and detecting and excluding outlier data from the metrology data.

In an embodiment, the method further includes obtaining values of a plurality of parameters of the patterning process; and selecting, via the metrology tool, metrology data such that each parameter of the plurality of parameters is within or below the respective tolerance band of the plurality of parameters.

Furthermore, according to an embodiment, there is provided a method of validating model prediction accuracy for a patterning process. The method includes identifying, via a processor, a portion of the substrate that has values of at least one parameter of one or more parameters of the patterning process outside a respective tolerance band of the one or more parameters; obtaining, via a metrology tool, metrology data corresponding to the portion of the substrate; processing, via the processor, the metrology data; and validating, via simulation of a process model, model prediction accuracy based on comparison between simulated data of the process model and the processed metrology data.

In an embodiment, the obtaining the metrology data includes guiding, via the processor, the metrology tool to the portion of the substrate; and sampling, via the metrology tool, data at the portion of the substrate.

In an embodiment, the processing the metrology data includes at least one of image processing; determining an average of the metrology data of the portion of the substrate; and detecting and excluding outlier data from the metrology data.

In an embodiment, the model prediction includes contours, CD, and/or resist profile.

In an embodiment, the portion corresponds to a region within the combined map where at one parameter of the one or more parameter is outside the respective tolerance band of the at least one parameter.

In an embodiment, the one or more parameter includes focus, mask CD, dose, and/or MSD.

In an embodiment, the identifying step further includes obtaining a plurality of process variations, and a combined process variation of the plurality of process variations; and identifying the portion of the substrate that has values of at least one parameter of one or more parameters of the patterning process outside a respective tolerance band of the one or more parameters.

In an embodiment, a process variation of the plurality of the process variations or the combined process variation is represented as a map of the substrate, wherein the map is a distribution of values of a process variable across the substrate.

Furthermore, according to an embodiment there is provided a method for determining hot spots of a patterning process. The method includes identifying, via a processor, a portion of the substrate that has values of one or more parameters of the patterning process greater than a hot spot threshold corresponding to the one or more parameters; obtaining, via a metrology tool, metrology data corresponding to the portion of the substrate; processing, via the processor, the metrology data; and detecting, via the processor, hot spot locations on the substrate based on the processed metrology data.

In an embodiment, the detecting the hot spot location includes performing a rule check on features at the portion of the substrate based on the metrology data; and detecting a defective feature on the substrate corresponding to violation of the rule check.

In an embodiment, the obtaining the metrology data includes guiding, via the processor, the metrology tool to the portion of the substrate; and sampling, via the metrology tool, data at the portion of the substrate.

In an embodiment, the processing the metrology data includes at least one of image processing; determining an average of the metrology data of the portion of the substrate; and detecting and excluding outlier data from the metrology data.

In an embodiment, the method further includes determining, via simulation of a process model, pattern sensitivity of the patterns within the portion of the substrate to a given process variation; and ranking a set of patterns based on the pattern sensitivity.

In an embodiment, the method further includes determining, via simulation of the process model, image contrast and image log-slope of the patterns within the portion of the substrate; and locating patterns within the portion of the substrate having relatively higher likelihood of stochastic failure based on the image contrast and the image log-slope.

In an embodiment, the identifying step further includes obtaining a plurality of process variations, and a combined process variation of the plurality of process variations; and identifying the portion of the substrate that has values of one or more parameters of the patterning process greater than a hot spot threshold corresponding to the one or more parameters.

In an embodiment, a process variation of the plurality of the process variations or the combined process variation is represented as a map of the substrate, wherein the map is a distribution of values of a process variable across the substrate.

Furthermore, according to an embodiment, there is provided a computer program product comprising a non-transitory computer readable medium having instructions recorded thereon, the instructions when executed by a computer implementing the method discussed above.

Embodiments will now be described in detail with reference to the drawings, which are provided as illustrative examples so as to enable those skilled in the art to practice the embodiments. Notably, the figures and examples below are not meant to limit the scope to a single embodiment, but other embodiments are possible by way of interchange of some or all of the described or illustrated elements. Wherever convenient, the same reference numbers will be used throughout the drawings to refer to same or like parts. Where certain elements of these embodiments can be partially or fully implemented using known components, only those portions of such known components that are necessary for an understanding of the embodiments will be described, and detailed descriptions of other portions of such known components will be omitted so as not to obscure the description of the embodiments. In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the scope encompasses present and future known equivalents to the components referred to herein by way of illustration.

DETAILED DESCRIPTION

Before describing embodiments in detail, it is instructive to present an example environment in which embodiments may be implemented.

Figure 1:
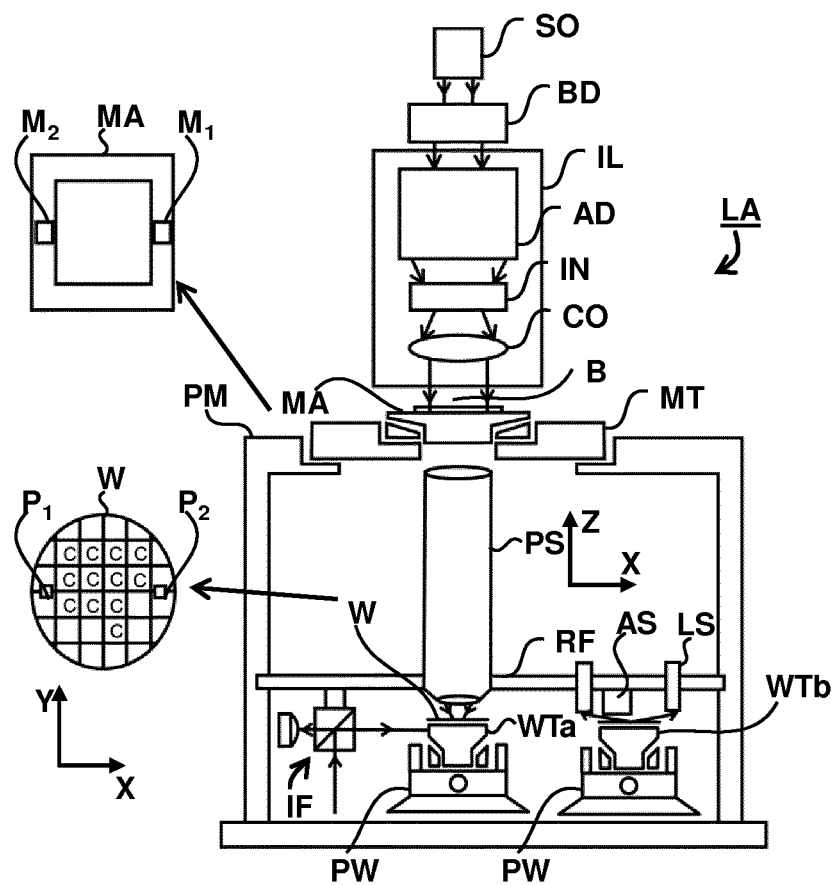
FIG. 1 schematically depicts a lithography apparatus according to an embodiment.

FIG. 1 schematically depicts an embodiment of a lithographic apparatus LA. The apparatus comprises:
- an illumination system (illuminator) IL configured to condition a radiation beam B (e.g. UV radiation or DUV radiation);
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT (e.g., WTa, WTb or both) constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies and often referred to as fields) of the substrate W, the projection system supported on a reference frame (RF).

As here depicted, the apparatus is of a transmissive type (e.g. employing a transmissive mask). Alternatively, the apparatus may be of a reflective type (e.g. employing a programmable minor array of a type as referred to above, or employing a reflective mask).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp. The source SO and the illuminator IL, together with the beam delivery system BD if required, may be referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

So, the illuminator IL may comprise adjuster AM configured to adjust the (angular/spatial) intensity distribution of the beam. Generally, at least the outer and/or inner radial extent (commonly referred to as σ-outer and σ-inner, respectively) of the intensity distribution in a pupil plane of the illuminator can be adjusted. The illuminator IL may be operable to vary the angular distribution of the beam. For example, the illuminator may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution. A desired illumination mode may be obtained, e.g., by inserting an optic which provides that illumination mode into the illuminator IL or using a spatial light modulator.

The illuminator IL may be operable to alter the polarization of the beam and may be operable to adjust the polarization using adjuster AM. The polarization state of the radiation beam across a pupil plane of the illuminator IL may be referred to as a polarization mode. The use of different polarization modes may allow greater contrast to be achieved in the image formed on the substrate W. The radiation beam may be unpolarized. Alternatively, the illuminator may be arranged to linearly polarize the radiation beam. The polarization direction of the radiation beam may vary across a pupil plane of the illuminator IL. The polarization direction of radiation may be different in different regions in the pupil plane of the illuminator IL. The polarization state of the radiation may be chosen depending on the illumination mode. For multi-pole illumination modes, the polarization of each pole of the radiation beam may be generally perpendicular to the position vector of that pole in the pupil plane of the illuminator IL. For example, for a dipole illumination mode, the radiation may be linearly polarized in a direction that is substantially perpendicular to a line that bisects the two opposing sectors of the dipole. The radiation beam may be polarized in one of two different orthogonal directions, which may be referred to as X-polarized and Y-polarized states. For a quadrupole illumination mode the radiation in the sector of each pole may be linearly polarized in a direction that is substantially perpendicular to a line that bisects that sector. This polarization mode may be referred to as XY polarization. Similarly, for a hexapole illumination mode the radiation in the sector of each pole may be linearly polarized in a direction that is substantially perpendicular to a line that bisects that sector. This polarization mode may be referred to as TE polarization.

In addition, the illuminator IL generally comprises various other components, such as an integrator IN and a condenser CO. The illumination system may include various types of optical components, such as refractive, reflective, magnetic, electromagnetic, electrostatic or other types of optical components, or any combination thereof, for directing, shaping, or controlling radiation.

Thus, the illuminator provides a conditioned beam of radiation B, having a desired uniformity and intensity distribution in its cross section.

The support structure MT supports the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a pattern in a target portion of the substrate. In an embodiment, a patterning device is any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The projection system PS has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PS will have a different Zernike expansion for each field point (i.e. for each spatial location in its image plane). The relative phase of the projection system PS in its pupil plane may be determined by projecting radiation, for example from a point-like source in an object plane of the projection system PS (i.e. the plane of the patterning device MA), through the projection system PS and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PS. The interference pattern is related to the derivative of the phase of the radiation with respect to a coordinate in the pupil plane in the shearing direction. The detector may comprise an array of sensing elements such as, for example, charge coupled devices (CCDs).

The projection system PS of a lithography apparatus may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The diffraction grating may be sequentially scanned in two perpendicular directions, which may coincide with axes of a co-ordinate system of the projection system PS (x and y) or may be at an angle such as 45 degrees to these axes. Scanning may be performed over an integer number of grating periods, for example one grating period. The scanning averages out phase variation in one direction, allowing phase variation in the other direction to be reconstructed. This allows the wavefront to be determined as a function of both directions.

The transmission (apodization) of the projection system PS in its pupil plane may be determined by projecting radiation, for example from a point-like source in an object plane of the projection system PS (i.e. the plane of the patterning device MA), through the projection system PS and measuring the intensity of radiation in a plane that is conjugate to a pupil plane of the projection system PS, using a detector. The same detector as used to measure the wavefront to determine aberrations may be used.

The projection system PS may comprise a plurality of optical (e.g., lens) elements and may further comprise an adjustment mechanism AM configured to adjust one or more of the optical elements so as to correct for aberrations (phase variations across the pupil plane throughout the field). To achieve this, the adjustment mechanism may be operable to manipulate one or more optical (e.g., lens) elements within the projection system PS in one or more different ways. The projection system may have a co-ordinate system wherein its optical axis extends in the z direction. The adjustment mechanism may be operable to do any combination of the following: displace one or more optical elements; tilt one or more optical elements; and/or deform one or more optical elements. Displacement of an optical element may be in any direction (x, y, z or a combination thereof). Tilting of an optical element is typically out of a plane perpendicular to the optical axis, by rotating about an axis in the x and/or y directions although a rotation about the z axis may be used for a non-rotationally symmetric aspherical optical element. Deformation of an optical element may include a low frequency shape (e.g. astigmatic) and/or a high frequency shape (e.g. free form aspheres). Deformation of an optical element may be performed for example by using one or more actuators to exert force on one or more sides of the optical element and/or by using one or more heating elements to heat one or more selected regions of the optical element. In general, it may not be possible to adjust the projection system PS to correct for apodization (transmission variation across the pupil plane). The transmission map of a projection system PS may be used when designing a patterning device (e.g., mask) MA for the lithography apparatus LA. Using a computational lithography technique, the patterning device MA may be designed to at least partially correct for apodization.

The lithographic apparatus may be of a type having two (dual stage) or more tables (e.g., two or more substrate tables WTa, WTb, two or more patterning device tables, a substrate table WTa and a table WTb below the projection system without a substrate that is dedicated to, for example, facilitating measurement, and/or cleaning, etc.). In such "multiple stage" machines the additional tables may be used in parallel, or preparatory steps may be carried out on one or more tables while one or more other tables are being used for exposure. For example, alignment measurements using an alignment sensor AS and/or level (height, tilt, etc.) measurements using a level sensor LS may be made.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

So, in operation of the lithographic apparatus, a radiation beam is conditioned and provided by the illumination system IL. The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Although specific reference may be made in this text to the use of lithography apparatus in the manufacture of ICs, it should be understood that the lithography apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

Various patterns on or provided by a patterning device may have different process windows. i.e., a space of processing variables under which a pattern will be produced within specification. Examples of pattern specifications that relate to potential systematic defects include checks for necking, line-end pull back, line thinning, CD, edge placement, overlapping, resist top loss, resist undercut and/or bridging. The process window of all the patterns on a patterning device or an area thereof may be obtained by merging (e.g., overlapping) process windows of each individual pattern. The boundary of the process window of all the patterns contains boundaries of process windows of some of the individual patterns. In other words, these individual patterns limit the process window of all the patterns. These patterns can be referred to as "hot spots" or "process window limiting patterns (PWLPs)," which are used interchangeably herein. When controlling a part of a patterning process, it is possible and economical to focus on the hot spots. When the hot spots are not defective, it is most likely that all the patterns are not defective.

Figure 2:
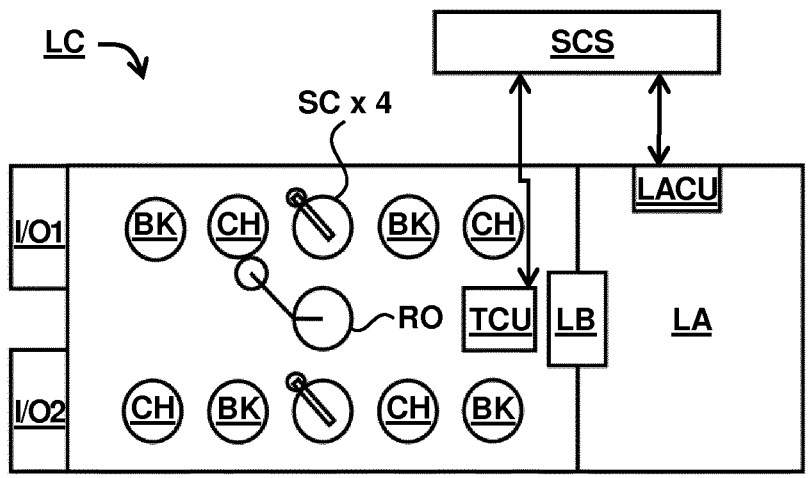
FIG. 2 schematically depicts an embodiment of a lithographic cell or cluster according to an embodiment.

As shown in FIG. 2, the lithographic apparatus LA may form part of a lithographic cell LC, also sometimes referred to a lithocell or cluster, which also includes apparatuses to perform pre-and post-exposure processes on a substrate. Conventionally these include one or more spin coaters SC to deposit one or more resist layers, one or more developers DE to develop exposed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU. Thus, the different apparatuses can be operated to maximize throughput and processing efficiency.

In order that a substrate that is exposed by the lithographic apparatus is exposed correctly and consistently and/or in order to monitor a part of the patterning process (e.g., a device manufacturing process) that includes at least one pattern transfer step (e.g., an optical lithography step), it is desirable to inspect a substrate or other object to measure or determine one or more properties such as alignment, overlay (which can be, for example, between structures in overlying layers or between structures in a same layer that have been provided separately to the layer by, for example, a double patterning process), line thickness, critical dimension (CD), focus offset, a material property, etc. Accordingly a manufacturing facility in which lithocell LC is located also typically includes a metrology system MET which measures some or all of the substrates W that have been processed in the lithocell or other objects in the lithocell. The metrology system MET may be part of the lithocell LC, for example it may be part of the lithographic apparatus LA (such as alignment sensor AS).

The one or more measured parameters may include, for example, overlay between successive layers formed in or on the patterned substrate, critical dimension (CD) (e.g., critical linewidth) of, for example, features formed in or on the patterned substrate, focus or focus error of an optical lithography step, dose or dose error of an optical lithography step, optical aberrations of an optical lithography step, etc. This measurement may be performed on a target of the product substrate itself and/or on a dedicated metrology target provided on the substrate. The measurement can be performed after-development of a resist but before etching or can be performed after-etch.

There are various techniques for making measurements of the structures formed in the patterning process, including the use of a scanning electron microscope, an image-based measurement tool and/or various specialized tools. As discussed above, a fast and non-invasive form of specialized metrology tool is one in which a beam of radiation is directed onto a target on the surface of the substrate and properties of the scattered (diffracted/reflected) beam are measured. By evaluating one or more properties of the radiation scattered by the substrate, one or more properties of the substrate can be determined. This may be termed diffraction-based metrology. One such application of this diffraction-based metrology is in the measurement of feature asymmetry within a target. This can be used as a measure of overlay, for example, but other applications are also known. For example, asymmetry can be measured by comparing opposite parts of the diffraction spectrum (for example, comparing the −1st and +1$^{st}$ orders in the diffraction spectrum of a periodic grating). This can be done as described above and as described, for example, in U.S. patent application publication US 2006-066855, which is incorporated herein in its entirety by reference. Another application of diffraction-based metrology is in the measurement of feature width (CD) within a target. Such techniques can use the apparatus and methods described hereafter.

Thus, in a device fabrication process (e.g., a patterning process or a lithography process), a substrate or other objects may be subjected to various types of measurement during or after the process. The measurement may determine whether a particular substrate is defective, may establish adjustments to the process and apparatuses used in the process (e.g., aligning two layers on the substrate or aligning the patterning device to the substrate), may measure the performance of the process and the apparatuses, or may be for other purposes. Examples of measurement include optical imaging (e.g., optical microscope), non-imaging optical measurement (e.g., measurement based on diffraction such as ASML YieldStar metrology tool, ASML SMASH metrology system), mechanical measurement (e.g., profiling using a stylus, atomic force microscopy (AFM)), and/or non-optical imaging (e.g., scanning electron microscopy (SEM)). The SMASH (SMart Alignment Sensor Hybrid) system, as described in U.S. Pat. No. 6,961,116, which is incorporated by reference herein in its entirety, employs a self-referencing interferometer that produces two overlapping and relatively rotated images of an alignment marker, detects intensities in a pupil plane where Fourier transforms of the images are caused to interfere, and extracts the positional information from the phase difference between diffraction orders of the two images which manifests as intensity variations in the interfered orders.

Metrology results may be provided directly or indirectly to the supervisory control system SCS. If an error is detected, an adjustment may be made to exposure of a subsequent substrate (especially if the inspection can be done soon and fast enough that one or more other substrates of the batch are still to be exposed) and/or to subsequent exposure of the exposed substrate. Also, an already exposed substrate may be stripped and reworked to improve yield, or discarded, thereby avoiding performing further processing on a substrate known to be faulty. In a case where only some target portions of a substrate are faulty, further exposures may be performed only on those target portions which are good.

Within a metrology system MET, a metrology apparatus is used to determine one or more properties of the substrate, and in particular, how one or more properties of different substrates vary or different layers of the same substrate vary from layer to layer. As noted above, the metrology apparatus may be integrated into the lithographic apparatus LA or the lithocell LC or may be a stand-alone device.

To enable the metrology, one or more targets can be provided on the substrate. In an embodiment, the target is specially designed and may comprise a periodic structure. In an embodiment, the target is a part of a device pattern, e.g., a periodic structure of the device pattern. In an embodiment, the device pattern is a periodic structure of a memory device (e.g., a Bipolar Transistor (BPT), a Bit Line Contact (BLC), etc. structure).

In an embodiment, the target on a substrate may comprise one or more 1-D periodic structures (e.g., gratings), which are printed such that after development, the periodic structural features are formed of solid resist lines. In an embodiment, the target may comprise one or more 2-D periodic structures (e.g., gratings), which are printed such that after development, the one or more periodic structures are formed of solid resist pillars or vias in the resist. The bars, pillars or vias may alternatively be etched into the substrate (e.g., into one or more layers on the substrate).

Figure 3:
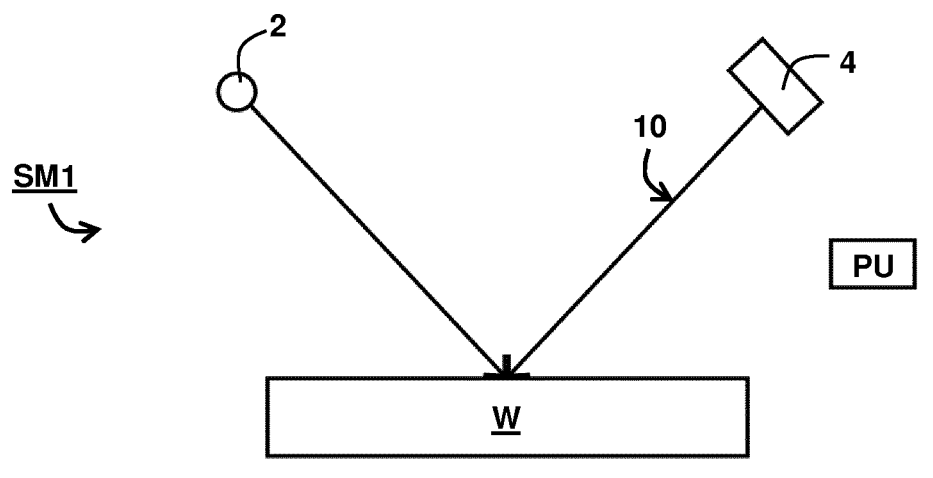
FIG. 3 schematically depicts an example inspection apparatus and metrology technique according to an embodiment.
Figure 3:
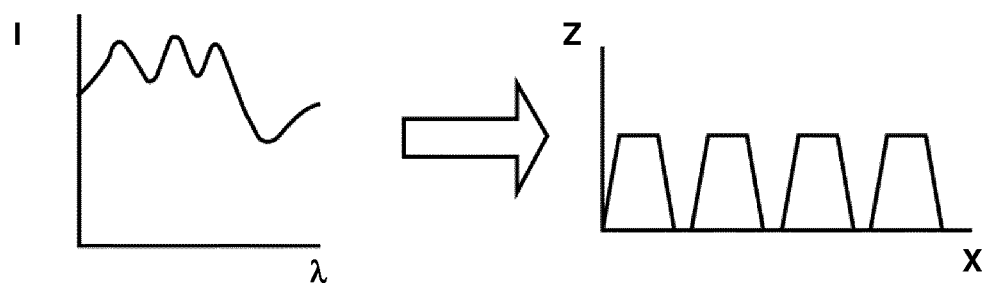

FIG. 3 depicts an example inspection apparatus (e.g., a scatterometer). It comprises a broadband (white light) radiation projector 2 which projects radiation onto a substrate W. The redirected radiation is passed to a spectrometer detector 4, which measures a spectrum 10 (intensity as a function of wavelength) of the specular reflected radiation, as shown, e.g., in the graph in the lower left. From this data, the structure or profile giving rise to the detected spectrum may be reconstructed by processor PU, e.g. by Rigorous Coupled Wave Analysis and non-linear regression or by comparison with a library of simulated spectra as shown at the bottom right of FIG. 3. The bottom right graph is a reconstructed profile corresponding to a spectrum graph illustrated at the bottom left. In general, for the reconstruction the general form of the structure is known and some variables are assumed from knowledge of the process by which the structure was made, leaving only a few variables of the structure to be determined from the measured data. Such an inspection apparatus may be configured as a normal-incidence inspection apparatus or an oblique-incidence inspection apparatus.

Figure 4:
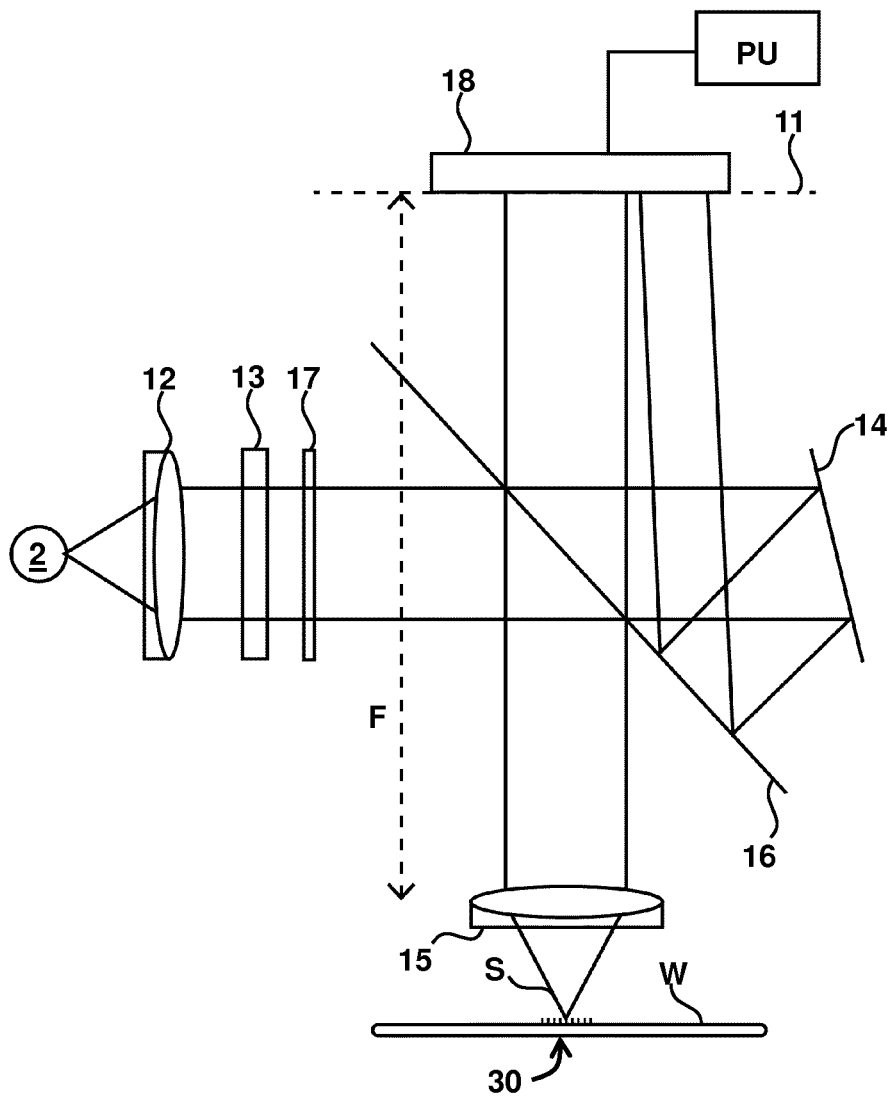
FIG. 4 schematically depicts an example inspection apparatus according to an embodiment.

Another inspection apparatus that may be used is shown in FIG. 4. In this device, the radiation emitted by radiation source 2 is collimated using lens system 12 and transmitted through interference filter 13 and polarizer 17, reflected by partially reflecting surface 16 and is focused into a spot S on substrate W via an objective lens 15, which has a high numerical aperture (NA), desirably at least 0.9 or at least 0.95. An immersion inspection apparatus (using a relatively high refractive index fluid such as water) may even have a numerical aperture over 1.

As in the lithographic apparatus LA, one or more substrate tables may be provided to hold the substrate W during measurement operations. The substrate tables may be similar or identical in form to the substrate table WT of FIG. 1. In an example where the inspection apparatus is integrated with the lithographic apparatus, they may even be the same substrate table. Coarse and fine positioners may be provided to a second positioner PW configured to accurately position the substrate in relation to a measurement optical system. Various sensors and actuators are provided for example to acquire the position of a target of interest, and to bring it into position under the objective lens 15. Typically many measurements will be made on targets at different locations across the substrate W. The substrate support can be moved in X and Y directions to acquire different targets, and in the Z direction to obtain a desired location of the target relative to the focus of the optical system. It is convenient to think and describe operations as if the objective lens is being brought to different locations relative to the substrate, when, for example, in practice the optical system may remain substantially stationary (typically in the X and Y directions, but perhaps also in the Z direction) and only the substrate moves. Provided the relative position of the substrate and the optical system is correct, it does not matter in principle which one of those is moving in the real world, or if both are moving, or a combination of a part of the optical system is moving (e.g., in the Z and/or tilt direction) with the remainder of the optical system being stationary and the substrate is moving (e.g., in the X and Y directions, but also optionally in the Z and/or tilt direction).

The radiation redirected by the substrate W then passes through partially reflecting surface 16 into a detector 18 in order to have the spectrum detected. The detector 18 may be located at a back-projected focal plane 11 (i.e., at the focal length of the lens system 15) or the plane 11 may be re-imaged with auxiliary optics (not shown) onto the detector 18. The detector may be a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam may be used, for example, to measure the intensity of the incident radiation. To do this, when the radiation beam is incident on the partially reflecting surface 16 part of it is transmitted through the partially reflecting surface 16 as a reference beam towards a reference mirror 14. The reference beam is then projected onto a different part of the same detector 18 or alternatively on to a different detector (not shown).

One or more interference filters 13 are available to select a wavelength of interest in the range of, say, 405-790 nm or even lower, such as 200-300 nm. The interference filter may be tunable rather than comprising a set of different filters. A grating could be used instead of an interference filter. An aperture stop or spatial light modulator (not shown) may be provided in the illumination path to control the range of angle of incidence of radiation on the target.

The detector 18 may measure the intensity of redirected radiation at a single wavelength (or narrow wavelength range), the intensity separately at multiple wavelengths or integrated over a wavelength range. Furthermore, the detector may separately measure the intensity of transverse magnetic- and transverse electric-polarized radiation and/or the phase difference between the transverse magnetic- and transverse electric-polarized radiation.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may be etched into or on the substrate (e.g., into one or more layers on the substrate). The pattern (e.g., of bars, pillars or vias) is sensitive to change in processing in the patterning process (e.g., optical aberration in the lithographic projection apparatus (particularly the projection system PS, focus change, dose change, etc.) and will manifest in a variation in the printed grating. Accordingly, the measured data of the printed grating is used to reconstruct the grating. One or more parameters of the 1-D grating, such as line width and/or shape, or one or more parameters of the 2-D grating, such as pillar or via width or length or shape, may be input to the reconstruction process, performed by processor PU, from knowledge of the printing step and/or other inspection processes.

In addition to measurement of a parameter by reconstruction, angle resolved scatterometry is useful in the measurement of asymmetry of features in product and/or resist patterns. A particular application of asymmetry measurement is for the measurement of overlay, where the target 30 comprises one set of periodic features superimposed on another. The concepts of asymmetry measurement using the instrument of FIG. 3 or FIG. 4 are described, for example, in U.S. patent application publication US2006-066855, which is incorporated herein in its entirety. Simply stated, while the positions of the diffraction orders in the diffraction spectrum of the target are determined only by the periodicity of the target, asymmetry in the diffraction spectrum is indicative of asymmetry in the individual features which make up the target. In the instrument of FIG. 4, where detector 18 may be an image sensor, such asymmetry in the diffraction orders appears directly as asymmetry in the pupil image recorded by detector 18. This asymmetry can be measured by digital image processing in unit PU, and calibrated against known values of overlay.

Figure 5:
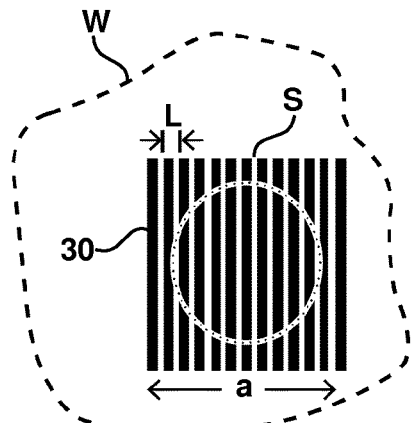
FIG. 5 illustrates the relationship between an illumination spot of an inspection apparatus and a metrology target according to an embodiment.

FIG. 5 illustrates a plane view of a typical target 30, and the extent of illumination spot S in the apparatus of FIG. 4. To obtain a diffraction spectrum that is free of interference from surrounding structures, the target 30, in an embodiment, is a periodic structure (e.g., grating) larger than the width (e.g., diameter) of the illumination spot S. The width of spot S may be smaller than the width and length of the target. The target in other words is 'underfilled' by the illumination, and the diffraction signal is essentially free from any signals from product features and the like outside the target itself. The illumination arrangement 2, 12, 13, 17 may be configured to provide illumination of a uniform intensity across a back focal plane of objective 15. Alternatively, by, e.g., including an aperture in the illumination path, illumination may be restricted to on axis or off axis directions.

Figure 6:
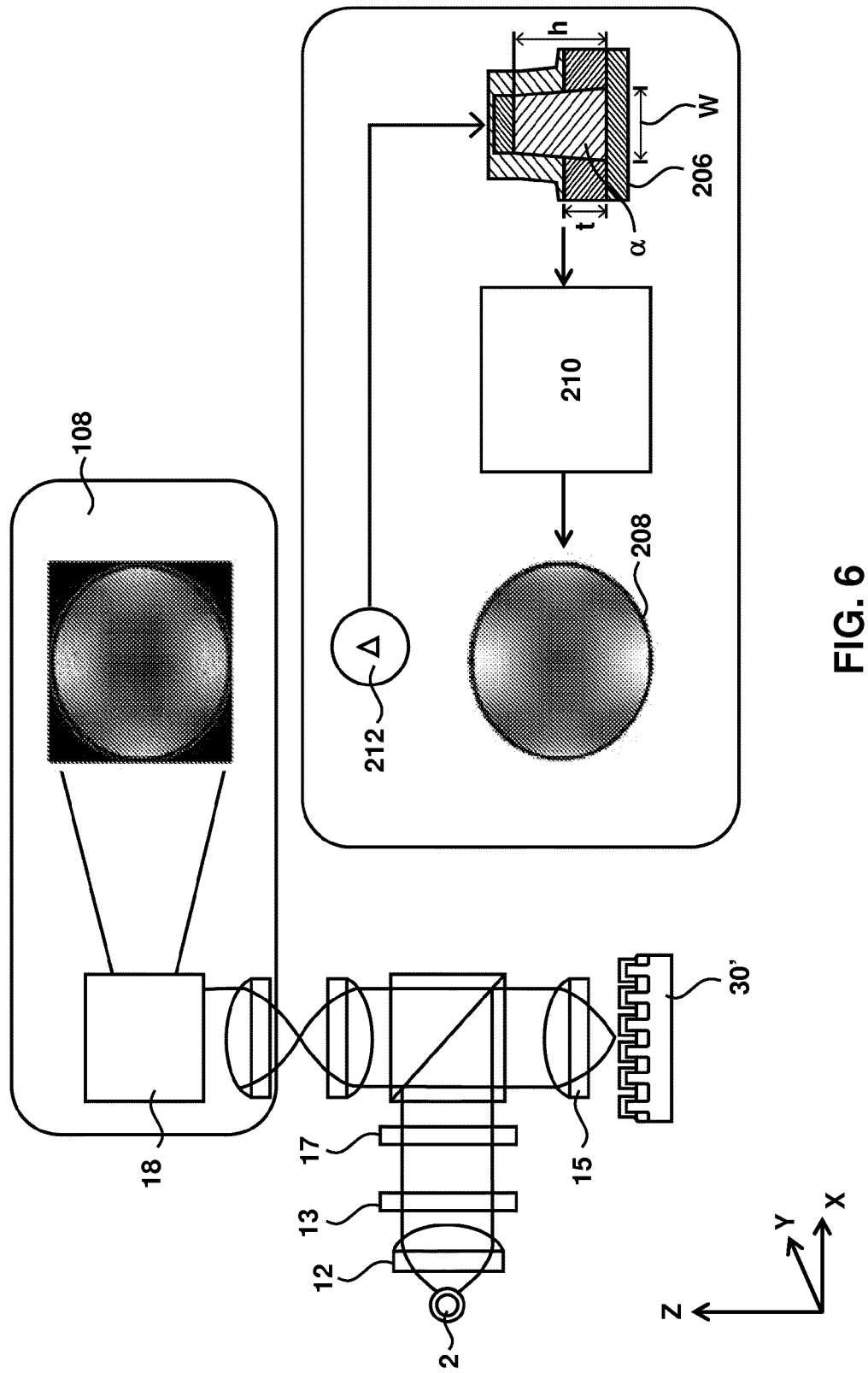
FIG. 6 schematically depicts a process of deriving a plurality of variables of interest based on measurement data according to an embodiment.

FIG. 6 schematically depicts an example process of the determination of the value of one or more variables of interest of a target pattern 30' based on measurement data obtained using metrology. Radiation detected by the detector 18 provides a measured radiation distribution 108 for target 30'.

For a given target 30', a radiation distribution 208 can be computed/simulated from a parameterized model 206 using, for example, a numerical Maxwell solver 210. The parameterized model 206 shows example layers of various materials making up, and associated with, the target. The parameterized model 206 may include one or more of variables for the features and layers of the portion of the target under consideration, which may be varied and derived. As shown in FIG. 6, the one or more of the variables may include the thickness t of one or more layers, a width w (e.g., CD) of one or more features, a height h of one or more features, and/or a sidewall angle α of one or more features. Although not shown, the one or more of the variables may further include, but is not limited to, the refractive index (e.g., a real or complex refractive index, refractive index tensor, etc.) of one or more of the layers, the extinction coefficient of one or more layers, the absorption of one or more layers, resist loss during development, a footing of one or more features, and/or line edge roughness of one or more features. The initial values of the variables may be those expected for the target being measured. The measured radiation distribution 108 is then compared at 212 to the computed radiation distribution 208 to determine the difference between the two. If there is a difference, the values of one or more of the variables of the parameterized model 206 may be varied, a new computed radiation distribution 208 calculated and compared against the measured radiation distribution 108 until there is sufficient match between the measured radiation distribution 108 and the computed radiation distribution 208. At that point, the values of the variables of the parameterized model 206 provide a good or best match of the geometry of the actual target 30'. In an embodiment, there is sufficient match when a difference between the measured radiation distribution 108 and the computed radiation distribution 208 is within a tolerance threshold.

Figure 7:
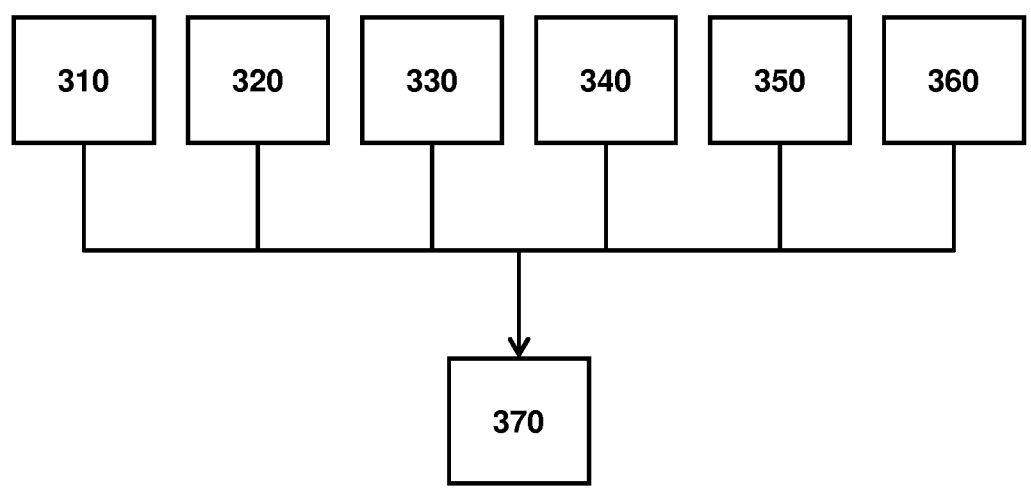
FIG. 7 shows example categories of processing variables according to an embodiment.

Variables of a patterning process are called "processing variables." The patterning process may include processes upstream and downstream to the actual transfer of the pattern in a lithography apparatus. FIG. 7 shows example categories of the processing variables 370. The first category may be variables 310 of the lithography apparatus or any other apparatuses used in the lithography process. Examples of this category include variables of the illumination, projection system, substrate stage, etc. of a lithography apparatus. The second category may be variables 320 of one or more procedures performed in the patterning process. Examples of this category include focus control or focus measurement, dose control or dose measurement, bandwidth, exposure duration, development temperature, chemical composition used in development, etc. The third category may be variables 330 of the design layout and its implementation in, or using, a patterning device. Examples of this category may include shapes and/or locations of assist features, adjustments applied by a resolution enhancement technique (RET), CD of mask features, etc. The fourth category may be variables 340 of the substrate. Examples include characteristics of structures under a resist layer, chemical composition and/or physical dimension of the resist layer, etc. The fifth category may be characteristics 350 of temporal variation of one or more variables of the patterning process. Examples of this category include a characteristic of high frequency stage movement (e.g., frequency, amplitude, etc.), high frequency laser bandwidth change (e.g., frequency, amplitude, etc.) and/or high frequency laser wavelength change. These high frequency changes or movements are those above the response time of mechanisms to adjust the underlying variables (e.g., stage position, laser intensity). The sixth category may be characteristics 360 of processes upstream of, or downstream to, pattern transfer in a lithographic apparatus, such as spin coating, post-exposure bake (PEB), development, etching, deposition, doping and/or packaging.

As will be appreciated, many, if not all of these variables, will have an effect on a parameter of the patterning process and often a parameter of interest. Non-limiting examples of parameters of the patterning process may include critical dimension (CD), critical dimension uniformity (CDU), focus, overlay, edge position or placement, sidewall angle, pattern shift, etc. Often, these parameters express an error from a nominal value (e.g., a design value, an average value, etc.). The parameter values may be the values of a characteristic of individual patterns or a statistic (e.g., average, variance, etc.) of the characteristic of a group of patterns.

The values of some or all of the processing variables, or a parameter related thereto, may be determined by a suitable method. For example, the values may be determined from data obtained with various metrology tools (e.g., a substrate metrology tool). The values may be obtained from various sensors or systems of an apparatus in the patterning process (e.g., a sensor, such as a leveling sensor or alignment sensor, of a lithography apparatus, a control system (e.g., a substrate or patterning device table control system) of a lithography apparatus, a sensor in a track tool, etc.). The values may be from an operator of the patterning process.

In an embodiment, a processing variable may be "modelable" or "unmodeled." A processing variable being modelable means that a contribution of a change of the processing variable (e.g., focus, dose, etc.) to metrology data can be determined by a computational model or is determined by a computational model. A simple example is that the contribution of a change of a modelable processing variable is the product of the change and a sensitivity of the metrology data with respect to the modelable processing variable. A processing variable being unmodeled means that a contribution of a change of the processing variable (e.g., development, etching, etc.) to metrology data is not computationally modeled at the appropriate time or because it cannot be determined by, or not accurately determined by, a computational model. A processing variable may be unmodeled because of lack of knowledge on how it impacts the metrology data. For example, some processing variables in the fourth category (e.g., the composition of the resist layer) and some processing variables in the sixth category (e.g., characteristics of PEB, development, etching, deposition, or doping) may not have a fully-understood relationship yet with the metrology data and thus contributions of their changes to the metrology data are not readily determinable by computational modeling. A processing variable may be unmodeled because its value is not known. A processing variable being unmodeled does not necessarily mean that computational modeling that processing variable is impossible. A processing variable may be unmodeled because the relationship between the processing variable and the metrology data is not yet understood.

Now, increasingly metrology has become a burden mostly in terms of time taken. This is, for example, particularly the case in the advent of multiple patterning techniques in the semiconductor industry. With multiple patterning techniques such as litho-etch-litho-etch (LELE) and/or sidewall assisted double patterning (SADP), the number of processing steps has increased significantly and therefore, so has the amount of metrology steps used for control and yield monitoring. Moreover, the amount of metrology increases for each node (i.e., reduction in feature size) as more layers are used in multiple patterning steps, and more patterning steps are used per layer.

Additionally or alternatively, there is an increased desire for defect determination and/or guided defect inspection. This involves substantially denser focus, overlay, and/or CD metrology than before.

Additionally or alternatively, there are ever tightening specifications on on-device CD, overlay, and/or focus performance. This drives manufacturing equipment specifications of, e.g., exposure tools and processing tools (e.g., deposition, etch, track, chemical mechanical polishing (CMP), etc.), from one node to the next. So, this drives tighter control and monitoring of performance which in turn drives the demand for ever increasing amounts of metrology for control and monitoring.

Additionally or alternatively, in line with tightening of the specifications on on-device CD, focus, and/or overlay performance, higher order corrections may be needed. A higher order correction is essentially a corrective action which is selective on a small spatial scale across all or part of the substrate (e.g. correction with a high spatial resolution). Higher order correction involves a denser sampling per substrate for metrology, thereby increasing the metrology burden perhaps beyond practical limits of metrology equipment productivity.

Additionally or alternatively, substrate to substrate variation may require further individual substrate level control (compared to, e.g., lot level control) and associated monitoring in order to achieve the desired CD, focus, and/or overlay performance. This may lead to measuring more substrates per lot and thus drive an increase in the amount of measurements used, perhaps beyond practical limits of metrology equipment productivity.

But, in order to meet the increased data demands, only adding metrology equipment or increasing metrology equipment productivity may not suffice. Moreover, it may not solve all problems such as obtaining dense CD, focus and/or overlay profiles across a substrate in a timely manner.

Therefore, in an embodiment, there is provided a method to, e.g., help improve metrology efficiency and/or accuracy. In the method, metrology data from multiple sources is combined and manipulated in order to derive accurate estimated values of one or more patterning process parameters (e.g., CD, focus, overlay, edge placement, etc.) for each of a plurality of locations across a substrate.

The method can offer an efficient method for hybrid metrology for one or more patterning process parameters (e.g., focus, CD, overlay, etc.). And, while embodiments herein will consider primarily particular examples of patterning process parameters namely focus, CD and overlay, it will be appreciated that one or more other or additional patterning process parameters can be the subject of the techniques herein.

In an embodiment, the method involves combination of metrology and other data from various sources. For example, combining measurements of a patterning process parameter of interest with data from one or more devices in the patterning process, such as data from one or more sensors of the lithographic apparatus. This combination of data will then be used to predict on-product performance in the form of, e.g., a patterning process parameter, such as CD, overlay, focus, pattern shift, edge placement (e.g., edge placement error), etc. and/or a parameter derived therefrom, such as yield, defects (e.g., risk of defect, defect counts, etc.), etc. However, such metrology data may be inaccurate and include variations associated with the metrology tool, the metrology process, and/or the patterning process. Accuracy of the metrology data is important to address the ever-shrinking requirements of the pattern sizes to be printed on the substrate and reduce errors during a simulation of the patterning process.

In an embodiment, the error may be related to, for example, an optical proximity correction model (OPC). Addressing an OPC model error budget is important as it affects the overall EPE budget related to the printed substrate. OPC models become more and more data driven, as technology node shrinks. However, without clean data (e.g., data that is filtered to reduce noise, has reduced systematic variations, etc.) as input to data processing algorithms (e.g., ASML Tachyon MXP (metrology for extreme performance)) or to OPC models of the patterning process (e.g., regular ASML Tachyon model or ASML Tachyon machine learning model), the resulting model tends to be overfitted. In addition, human/machine resources are required to (semi-)manually inspect and clean raw substrate measurement data.

To clean metrology data, existing techniques use averaging of raw substrate measurement data without consideration of process variations. Although outliers are filtered out, systematic errors still exist in the averaged substrate measurement data. These "averaged" systematic errors are either hard to be fitted by a computational lithographic model, or likely to cause overfitting. Simply collecting more raw data may actually make the "averaged" systematic errors worse.

Figure 8:
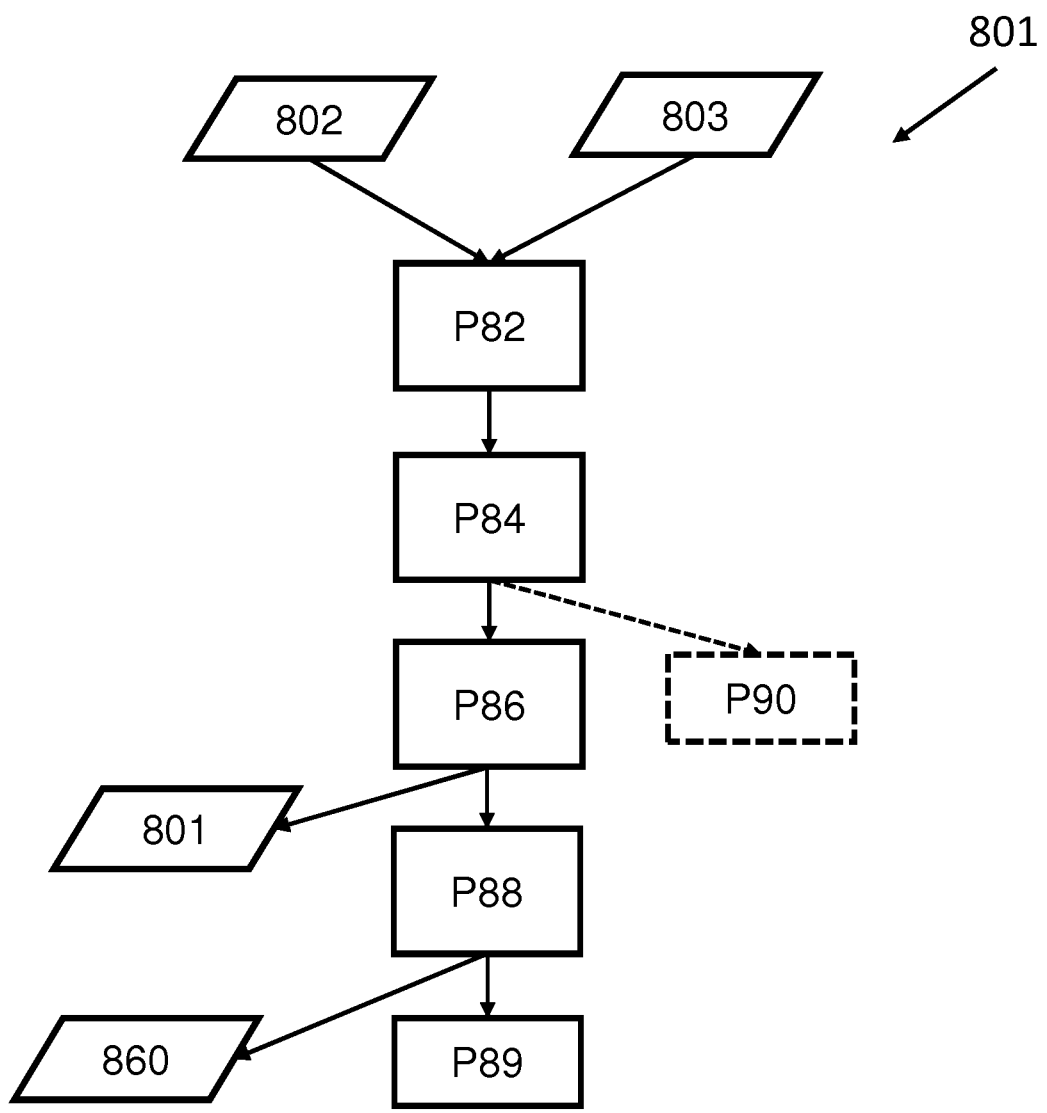
FIG. 8 describes method for sampling of metrology data according to an embodiment.

FIG. 8 describes a method 800 for sampling metrology data. The sampled metrology data can be used for different purposes of the patterning process such as calibrating a process model of a patterning process, identifying (e.g., via a processor such as processor 104 of FIG. 15) process window limiting patterns (e.g., hot spots) accurately, guiding a metrology tool to a location of interest such as hot spots or locations with low systematic variability, or other applications that use metrology data. In an embodiment, the method combines a plurality of process variation maps obtained and/or generated based on the metrology data. A combined map may be used to sample metrology data at a location of interest. In an embodiment, the locations of interest are, for example, portions of substrate having relatively low systematic variations within the combined map. The sampled data from such locations of interest will have low variability that allows to accurately characterize a parameter of the patterning process. Thus, the sampled data can accurately calibrate process models of the pattering process. A process model may be any model representing an aspect of the patterning process. For example, a resist model, an optics model, a mask model, an OPC model, an etch model, or other models related to the patterning process. Such model may be empirical models, physics based model, machine learning model or a combination thereof. The process model includes model parameters that are calibrated for a particular process based on metrology data. In an embodiment, any statistical technique may be employed for model calibration including, but not limited to, linear regression, simplex search, genetic algorithm, deep convolutional neural network, etc.

When such calibrated models are employed in patterning process simulation, the results of simulation will be more accurate. In an embodiment, the results of the simulation may be values of one or more parameters of interest, adjustments to the patterning process, etc. Effectively, the patterning process produces improved printed substrate with high yield.

The method 800, in process P82, involves obtaining a plurality of process variations 802 based on the metrology data (or simulation data), and a combined process variation 803 of the plurality of process variations. Any process variation may be represented as a vector or a map capturing/showing variation in values of the process variable on a substrate. The following discussion refers to a process variation as a process variation map to explain different aspects of the present invention, but such use of map does not limit the scope of the present disclosure, as can be understood by a person skilled in the art.

In an embodiment, the process variation map 802 refer to variations of a process variable or related parameter of the patterning process. The terms "process variation maps" as used herein can be used interchangeably with a map of a parameter of the patterning process. As an example, the plurality of process variation maps includes maps of process variable including dose, focus, critical dimension uniformity (CDU), mask CDU, mask absorber thickness uniformity, moving standard deviation (msd) in x, y, z direction (e.g., msdx, msdy, msdz), etc. In an embodiment, the process variation map or the fingerprint of a process variable or a parameter of the patterning process may be determined using, for example, method discussed in a PCT application publication number WO2017144379A1, which is incorporated herein in its entirety by reference.

The process variation map 802 shows contribution of the process variable to a patterning process parameter of interest as spatially distributed across a die, a field or a substrate which can then be characterized as a fingerprint. And, similarly, combined contributions across the die, the field or the substrate can be characterized as a process variation map.

In an embodiment, the process variation map (e.g., focus map) is generated based on a combination of measured data from a metrology tool and information from log files related to a patterning apparatus (e.g., a scanner) generated during the patterning process. For example, diffraction-based focus data (e.g., measured by YieldStar metrology tool) and information from scanner log files (e.g., scanner leveling non-correctable error (NCE) and servo errors) may be combined to generate a focus map. In an embodiment, the diffraction-based focus data is sparsely sampled but reflects accurate measurements on the substrate, and the log file information is densely sampled but is less accurate. Further, the measured data and information from log files may be combined (e.g., including interpolation, Gaussian filtering, etc.) to generate the process variation map (e.g., focus map). The end result is a hybrid dense focus map, which is both densely sampled and accurate.

In another embodiment, a plurality of contributions of the process variables can be combined to yield a derived fingerprint or a process variation map. For example, a focus fingerprint on a product substrate can be, for instance, a composite of focus contributions due to unflatness of that substrate, a focus error associated with the projection system of the lithographic apparatus during the substrate's exposure, a height error made by the substrate position control loop during exposure, and a residual fingerprint of the focus setup of the lithographic apparatus.

In an embodiment, for example, a focus map F(x, y) may be generated based on different focus contributions of different processing variables such as focus error (FE) associated with the projection system of the lithographic apparatus during the substrate's exposure, a height error (e.g., moving standard deviation ($MSD_z$)) made by the substrate position control loop during exposure, and unflatness (P) of that substrate. For example, the focus map may be generated based on following equation:

$$F(x,y)=a_1*F(FE)(x,y)+b_1*F(MSD_z)(x,y)+c_1*F(P)(x,y)+\ldots$$

In the above focus map equation, the various functions can be obtained by simulation, mathematical modeling and/or experimentation. Moreover, there may be cross terms that are not shown here (such as focus as a function of FE times MSD, etc.). To obtain an absolute value of focus, a nominal value or simulated value of the focus can be combined with the contributions. The coefficients such as $a_1$, $b_1$, $c_1$ are sensitivities of the focus with respect to the respective processing variables or their functions. In this example, the contributions are across a substrate but in an embodiment, one or more of the contributions may be per die/field (which could then be repeated across the substrate depending on, e.g., applicable conditions at each of the instances).

Similarly, a map of a parameter of interest may be determined based on identifying one or more contribution of a process variable to the parameter of interest. In an embodiment, a map may be generated based on empirical model fitted using metrology data. For example, CD=a1*DOSE+a2*$FOCUS^2$+a3*MSDx+a4*MSDy+a5*MSDz. Moreover, there may be cross terms that are not shown here and the relations may be different (e.g., a relation, such as focus and/or MSDz, may not be purely quadratic, and could have linear and $3^{rd}$ order terms). In an embodiment, the contributions may be respectively focus (F), moving standard deviation ($MSD_z$) and moving standard deviation ($MSD_x$) distributions in which case a CD model would be used to combine them into a CD distribution. Moreover, there may be cross terms that are not shown here (such as CD as a function of F times MSD, etc.).To obtain an absolute value of CD, a nominal value or simulated value of the CD can be combined with the contributions. The coefficients such as $a_1$, $b_1$, $c_1$ are sensitivities of the CD with respect to the processing variables or their functions.

Figure 9A:
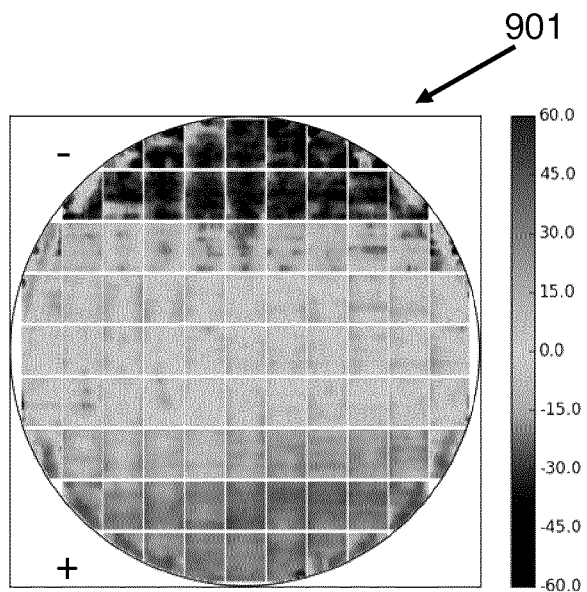
FIG. 9A is an example of a hybrid dense focus map according to an embodiment.
Figure 9B:
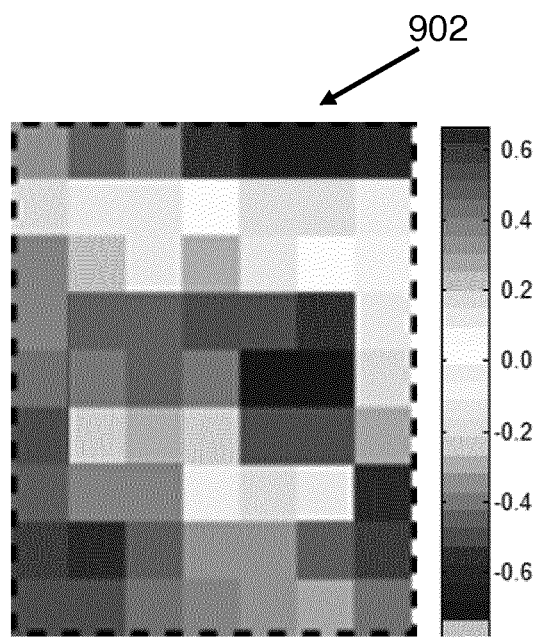
FIG. 9B is an example of a mask CD uniformity map according to an embodiment.
Figure 9C:
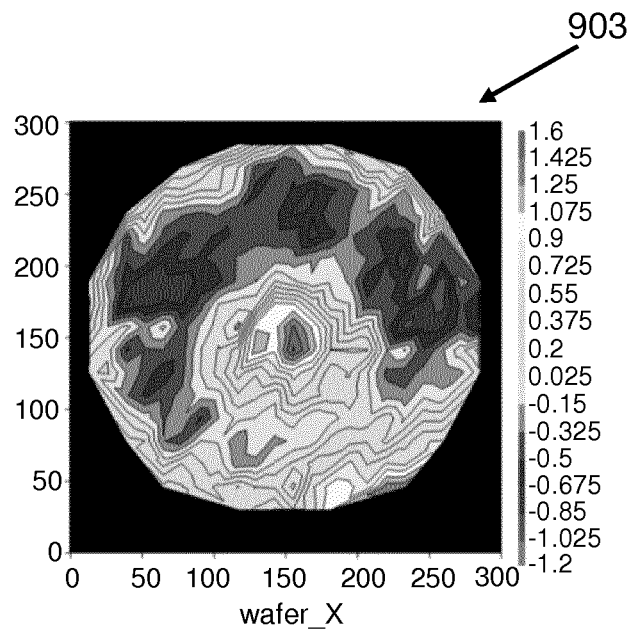
FIG. 9C is an example of a wafer CD uniformity map according to an embodiment.
Figure 9D:
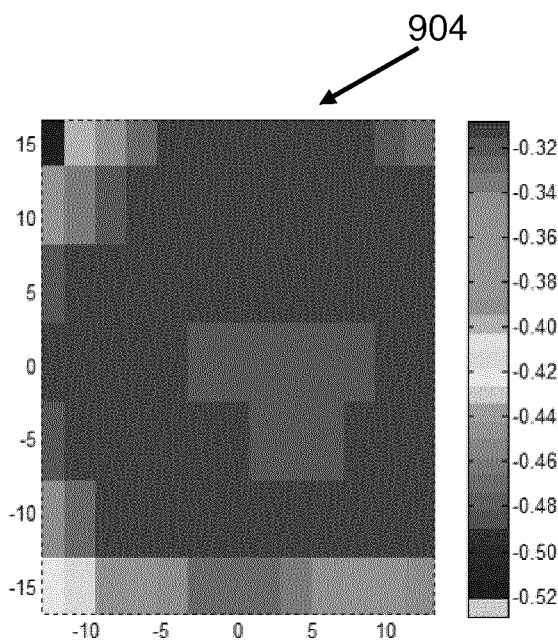
FIG. 9D is an example of a mask absorber thickness uniformity map according to an embodiment.

FIGS. 9A-9D show examples of the process variation maps. FIG. 9A is a hybrid dense focus map 901 which may be obtained and/or generated based on, for example, a combination of measured data from a metrology tool and information from log files, as discussed above. FIG. 9B is a mask CD uniformity map 902 that may be obtained from, for example, measurement data of CDs of selected patterns (e.g., hot spot patterns) of a mask used in the patterning process. FIG. 9C is a CD uniformity map 903 representing uniformity in CD values across the substrate. FIG. 9D is an example EUV mask absorber thickness uniformity map 904 that represents thickness of one or more layers deposited (or etched away) on the mask. In an embodiment, maps reveal variations in the process variables at different locations on the substrate that may affect the metrology data. In an embodiment, the variations in a first location (e.g., center or edge) of the substrate may be significantly greater than variations in other locations on the substrate. The first location(s) (e.g., center) may indicate higher error in the corresponding metrology data. Based on one or more such locations, the metrology data may be corrected to compensate for the variations.

In an embodiment, the process variation map may have different units based on the process variables or parameters of the patterning process being measured. In an embodiment, the process variation map is converted into a common unit such as intensity or a color gradient (e.g., RGB) values. This can enable combination of different maps and perform different operations such as addition, subtraction, convolution, etc.

In an embodiment, a combined map 803 is a combination of the plurality of process variation maps. For example, different maps associated with parameters of the patterning process may be combined. For example, maps 901-904 (in FIG. 9A-9D) may be images that can be combined using image processing operations to generate a combined map 803. In an embodiment, the combined map generated by converting different maps to same units or to same scale (e.g., at wafer level) and then combining the process variation maps. Then, the combination may involve adding values of maps having same units or representing values of different maps in a vector form. A preferable way of combining may be to keep the process variation maps in their original format (but they should be at same scale such as at wafer level), and the combined map is simply a map that contains all the information in its constituent maps (without adding the pixels).

In an embodiment, the combining of the process variation maps involves a transformation operation via transformation functions, for example, to convert mask CDU map to a wafer level map. For example, the mask CDU map may be on a reticle scale (e.g., FIGS. 9B and 9D) which may be transformed into a wafer level map (e.g., FIGS. 9A and 9C) by replicating the mask CDU map (e.g., FIGS. 9B and 9D) throughout the wafer (e.g., each die of the wafer). Once the process variation maps (e.g., focus map and mask CDU map) are at similar scale (e.g., wafer level), then the maps may be combined, for example, in the form of two bit representation or vector form, where one element (or a first bit) represents information of focus and the other element (or a second bit) represents information of the mask CDU.

Further, the method, in process P84, involves identifying a portion of the substrate that fall within tolerance bands of one or more parameters of the patterning process. In an embodiment, the portion is identified based on the combined map. In an embodiment, the portion of the substrate have relatively less systematic variations within the combined map 803 of the plurality of process variation maps. For example, FIG. 10 shows an example of the combined map having three areas with different systematic variations.

Figure 10:
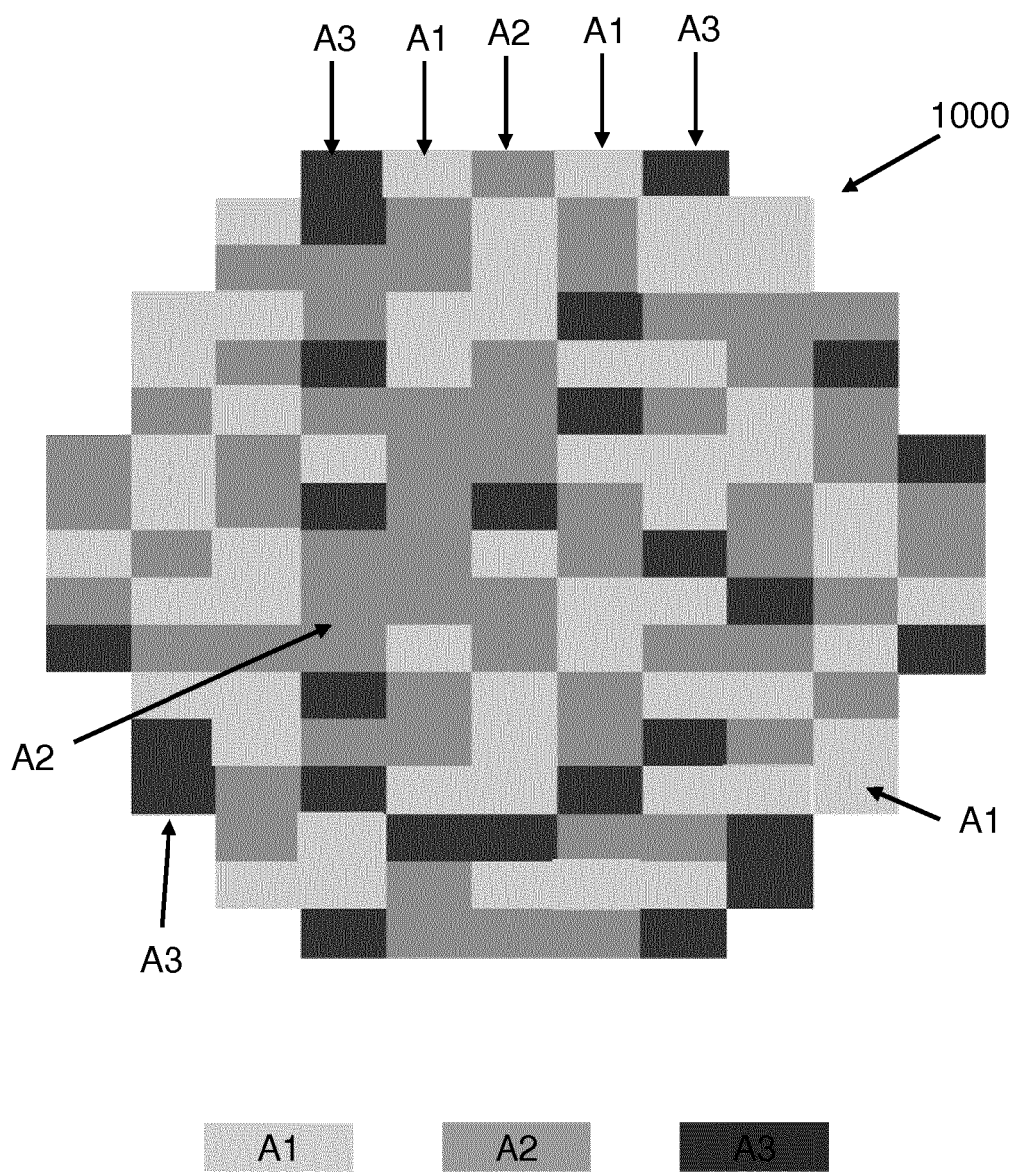
FIG. 10 is an example of a combined map according to an embodiment.

The example combined map, in FIG. 10, is a demarcated wafer map, where demarcations within the wafer map refer to straight boundaries (in reality, "wavy" boundaries are more likely). In an embodiment, granularity and/or the boundary of demarcation may change when more process variation maps are incorporated to generate the combined map. In an embodiment, for EUV lithography based wafer, the combined process variation map can take into account a flare map at a wafer scale. In addition, factors related to through-slit effects including mask shadowing, source, and aberration may be considered, for example, for data selection within the demarcated wafer map.

In FIG. 10, a first area(s) A1 (lightest grey regions) has a first variation (lowest across the substrate), a second area(s) A2 has a second variation (relatively higher than the first variation), and a third area(s) A3 (darkest grey regions) has a third variation (highest across the substrate). Thus, in an embodiment, metrology data corresponding to the first area A1 may be of interest, for example, for model calibration. In an embodiment, data may be sampled from the first area having relatively low variation within the substrate.

The method, in process P86 (and P90), involves obtaining metrology data 801 corresponding to the portion of the substrate. In an embodiment, the metrology data 801 includes image captures by a metrology tool (e.g., SEM images), measurements on substrate (e.g., CD), contour extraction, measurements related to resist profile (e.g., geometric shape), etc. In an embodiment, the process P86 (and/or P90) involves obtaining a plurality of parameters (e.g., CD, EPE, resist profile, etc.) and selecting metrology data such that each parameter of the plurality of parameters is within or below the respective tolerance band of the plurality of parameters.

In an embodiment, the method, in process P90, may involve guiding a metrology tool to the portion of the substrate and collecting metrology data at the portion of the substrate. In an embodiment, the guiding involves generating a signal to move the metrology tool or an inspection apparatus in relation to a substrate (or a patterning device), while the substrate (or a patterning device) remains stationary, to enable measurements at a location of interest. In an embodiment, the location of interest may be the first area A1 (in FIG. 10) having lowest process variation or the third area having highest process variation within the combined map 803. In an embodiment, relatively less data may be collected at the first location than at the third location, thus reducing the metrology effort and save time in taking measurements where variations are low and few sample data points may be representative of values of the process variables. In an embodiment, additional measurements may be taken at the third location, as higher variation may indicate hot spots and higher probability of error in those location and additional measurements may assist in accurately characterizing the process variables.

In an embodiment, the measurement data (e.g., metrology data 801) may also include measured values of a parameter (e.g., CD, overlay, dose, focus) of the patterning process that enables computation of the metrology data (e.g., via, simulation), metrology recipe or substrate measurement recipe used during measurements, etc. Non-limiting examples of the metrology data may include a critical dimension (CD), critical dimension uniformity (CDU), sidewall angle, edge position, overlay, focus, pattern shift, etc. The metrology data may be the values of a characteristic of individual patterns or a statistic (e.g., the mean) of the characteristic of a group of patterns.

In an embodiment, the term "metrology recipe" or "substrate measurement recipe" may include one or more parameters of the measurement itself, one or more parameters of a pattern measured, or both. For example, if the measurement used in a substrate measurement recipe is a diffraction-based optical measurement, one or more parameters of the measurement itself may include a wavelength of measurement radiation, a polarization of measurement radiation, an incident angle relative to the substrate of measurement radiation, and/or the relative orientation relative to a pattern on the substrate of diffracted measurement radiation. The one or more parameters of the measurement itself may include one or more parameters of the metrology apparatus used in the measurement. A pattern measured may be a pattern whose diffraction is measured. The pattern measured may be a pattern specially designed or selected for measurement purposes (also known as a "target" or "target structure"). Multiple copies of a target may be placed on many places on a substrate. One or more parameters of the pattern measured may include the shape, orientation and/or size of at least part of the pattern. A substrate measurement recipe may be used to align a layer of a pattern being imaged against an existing pattern on a substrate. A substrate measurement recipe may be used to align the patterning device to the substrate, by measuring a relative position of the substrate. In an embodiment, metrology data (e.g., CD) may be collected using a scanning electron microscope (e.g., as discussed with respect to FIGS. 13-14).

After collecting metrology data at the portions (e.g., having low process variations) on the substrate, the method, in process P88, involves processing the metrology data corresponding to the portion of the substrate. In an embodiment, the processing of the metrology data comprises image processing (e.g., of SEM image). The image processing may involve anti-blur filtering, low pass filtering, edge detection (e.g., edges of features on a substrate), or other image processing known to a person skilled in the art. In an embodiment, the processing may involve determining an average of the metrology data of the portion of the substrate, and/or detecting and excluding outlier data from the metrology data.

In an embodiment, all the metrology data may be averaged. In yet another embodiment, the metrology data that fall within a given tolerance band of one or more parameters of the patterning process may be averaged. The given tolerance band may be an acceptable variation in the parameter. The given tolerance may be provided by a chip designer, determined by a simulation of the patterning process, etc. In an embodiment, the given tolerance band is determined during the process window determination process. In an embodiment, for example: (i) a focus of the patterning apparatus may be associated with a focus tolerance band represented by a focus deviation ±Δf, where the focus deviation is deviation from a nominal or desired focus value; (ii) mask CD of a patterning device may be associated with a mask tolerance band represented by a CD deviation ±Δm, where the CD deviation is deviation of a CD of a pattern from desired CD value; (iii) a moving average standard deviation MSD(x,y,z) may be associated with a movement tolerance band represented by a displacement deviation ±Δmsd in, for example, x, y, and/or z direction; and (iv) a track deviation of a pattern may be associated with a track tolerance band of ±Δtrack. Thus, the process P88 outputs processed sample data 860 that has higher accuracy compared to data averaged over an entire substrate. In an embodiment, for example, in EUV lithography a flare map at wafer scale (i.e., at wafer level) and corresponding flare tolerance band may be used to generate the combined map. In this case, metrology data that fall within the flare tolerance band (e.g., nominal flare ±Δflare) may be averaged. In an embodiment, data selection within the demarcated wafer map may further consider through-slit effects, including mask shadowing, source, and aberration. In this case, only data within the same area (e.g., A1) and within the same slit location tolerance band (e.g., slit location ±Δslit) may be averaged.

In an embodiment, the method, in process P89, involves calibrating a process model (e.g., OPC model) based on the processed sample of metrology data (i.e., the processed sample data 860). In an embodiment, the calibrating of the process model may involve improving an objective function or a merit function. For example, the objective function may be based on an edge placement error (EPE), an overlay error, or other metric related to the patterning process. In an embodiment, the objective function is a root mean squared error (RMS) or other statistical measure of a difference between model prediction and wafer measurements such as CD, EP, etc. CD gauge measures a distance between two edge points on a pattern, while EP gauge stipulates a position of one edge point of a pattern. Both types of gauges may be obtained from the processed data 860. In an embodiment, during the model calibration, values of model parameters may be identified that reduces (in an embodiment, minimizes) the objective function. In an embodiment, the model calibration is simulation-based, where one or more process models may be executed. In an embodiment, the OPC model may be an empirical model, a machine learning model, physics-based model or a combination thereof that are configured to predict optical proximity corrections such as assist features which assist in printing of a design pattern on the substrate. Once the OPC model is calibrated, it can be used to do OPC, Lithographic manufacturability check (LMC) (i.e., verification of OPC), and source mask optimization (SMO), among other things.

The above method has several advantages and applications. For example, if several systematic errors—such as focus error, mask error, MSD, track signature—are present in the raw data, such systematic errors will be substantially removed. One or more process variation maps may be used as guidance to smartly sample, for example, SEM images.

Based on the combined process variation map, a substrate can be demarcated into the following example areas: Area-1 (e.g., A1 in FIG. 10)—where all process variations are small (within a given tolerance band); Area-2 (e.g., A2 in FIG. 10)—where most (e.g., 4 out of 5 or more than 90%) process variations are small except for a few (e.g., less than 10%) outside the given tolerance band; and Area-3 (e.g., A3 in FIG. 10)—where most (e.g., more than 90%) process variations are large (i.e., substantially outside the given tolerance band).

In an embodiment, the Area-1 is an overlapped area that is ideal for reducing systematic error. The Area-2 can be used for testing model prediction and checking model sensitivity with respect to a given process parameter (e.g., dial in a Δfocus and compare model prediction with substrate data from Area-2 wherein only focus has larger-than-tolerance variation). There can be several different types of Area-2, e.g., one focus-dominated (only focus has larger-than-tolerance variation) Area-2, one mask-dominated Area-2, one MSD-dominated Area-2, etc.

Furthermore, the combined map allows the present methods to be extended for determining guided hot spot detection and guided stochastic failure detections. In an embodiment, the method further includes identifying a portion (e.g., Area 3) of the substrate within the combined map that has values outside the tolerance band of one or more parameters of the patterning process; and guiding the metrology tool to the identified portion for hot spot detection. Furthermore, the method can include determining, via simulation of the process model, pattern sensitivity of the patterns within the portion (e.g., Area 3) of the substrate to a given process variation map, and ranking a set of patterns based on the pattern sensitivity. Thus, based on the ranking of the set of patterns, the metrology tool may be guided to the patterns having higher ranks to make measurements. Such guided measurements be used for hot spot detection, thereby saving metrology time and resources and effectively improving the yield of the patterning process.

For example, the Area-3 is where most hotspots will be found, which can be useful for guided hotspot detection. For example, simulations may be performed to determine pattern sensitivity to any given process variation, where the pattern sensitivity refers to an amount of change (e.g., in terms of shape, size, etc.) in pattern due to a change in a process parameter. Based on the sensitivity, ranks may be assigned to patterns having a likelihood of those patterns being hotspot candidates. For example, Area-3 is the area where both focus error and mask error are larger than tolerance. In an embodiment, a first set of patterns with high sensitivity to both focus error and mask error can be ranked highest since it will have highest likelihood of being a hotspot, followed by a second set of patterns sensitive only to focus error or mask error, which are followed by a third set of patterns that are sensitive to neither focus error nor mask error.

In an embodiment, the method includes determining, via simulation of the process model, image contrast and image log-slope of the patterns within a portion of the substrate and locating patterns within the another portion of the substrate having relatively higher likelihood of stochastic failure based on the image log-slope.

For example, the Area-3 is useful for predicting or identifying patterns on a wafer that may exhibit stochastic failure (i.e., defective patterns). Since large process variations will likely reduce the imaging contrast and the image log-slope (ILS), the likelihood of printing defective patterns due to photon and resist stochastics also increases. For example, by simulating ILS and ranking patterns by ILS (e.g., patterns with low ILS will be ranked lower than patterns with high ILS) for patterns in Area-3, the likelihood of locating patterns with stochastic failure is significantly enhanced for patterns with relatively low-ILS compared to other patterns on the wafer. The likelihood of finding hotspots and stochastic failures in Area-3 is much higher than that in Area-1 or Area-2.

The method enables faster and smarter sampling of raw substrate data (i.e., not all areas of the substrate are sampled). The method saves data cleaning time as smartly sampled wafer data have less metrology errors and/or printing failures. The model calibrated (e.g., calibrated OPC model) from such clean data is more accurate and predictive in general, and has less data overfitting related issues. As the methods include process of smartly (e.g., selectively measuring data instead of measuring entire surface) obtaining metrology data of specific interest (e.g., at areas A1, A2, and/or A3), the process may be referred to as smart metrology or smart metrology for big data.

Figure 11:
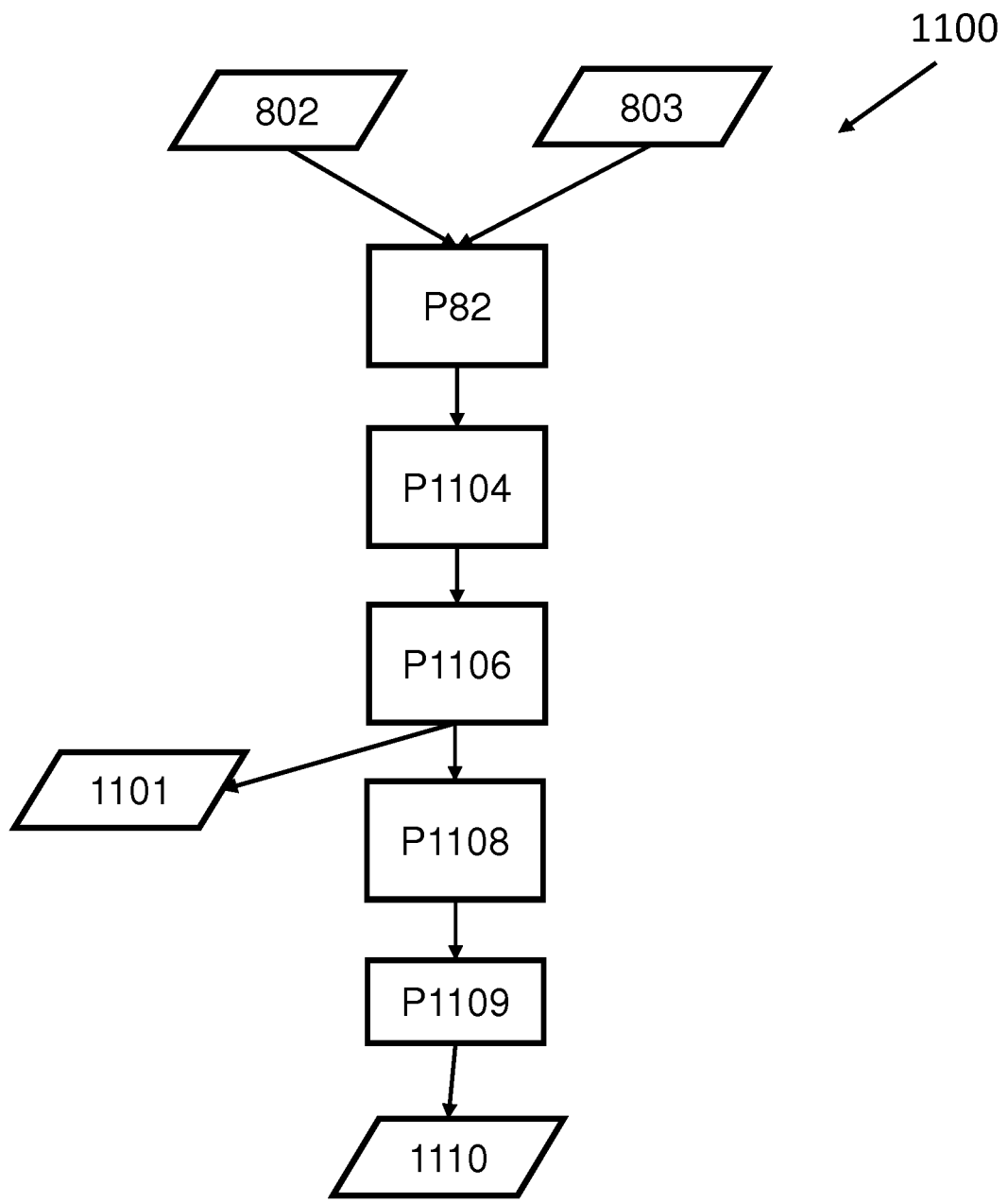
FIG. 11 describes method for model prediction according to an embodiment.

FIG. 11 describes method 1100 for model validation for a patterning process. In an embodiment, the above method may be extended to determine model prediction accuracy (e.g., of simulated contours, CDs, resist profiles, etc.) based on smartly selected metrology data. Model prediction accuracy indicates how close the model prediction is to the metrology data. A high accuracy indicates the difference between the model prediction and the metrology data is zero or substantially close to zero. Thus, validations and/or improvements to patterning process may be performed based on the model predictions of the calibrated model based on the selected metrology data.

In an embodiment, the present method involves obtaining a plurality of process variation maps, and a combined process variation map of the plurality of process variation maps, as discussed earlier, in process P82.

Similar to the process P84, the method 1100 in process P1104 involves identifying, via a processor (e.g., processor 104), a portion of the substrate (e.g., within the combined map 803) that has values of at least one of the one or more parameters outside a respective tolerance band of the one or more parameters of the patterning process. In an embodiment, the portion of the substrate refers to area A2 (in FIG. 10), where variations of most of the parameters (e.g., CD, dose, MSD) are within the tolerance band except for at least one parameter (e.g., focus) that has process variations outside the respective tolerate band (e.g., ±5 nm).

For example, the area A2 is the area where 4 out of 5 parameters have process variations within their tolerance bands, except for 1 parameter. For example, the parameter focus may have process variations outside of the tolerance band (e.g., ±5 nm). For example, the focus may reach a value of F0+15 nm (±2 nm), where F0 is the nominal focus. Hence, data within such portion may be processed (e.g., averaged), even if one of the parameters is outside the tolerance band. The processed data can be further used for model prediction. In an embodiment, the calibrated model may be simulated by varying focus, e.g., a focus offset of 15 nm, and data related to the simulated patterns within the area A2 may be compared with the processed data from A2. In the preceding example, parameters focus is used as an example to explain the concept and does not limit the present disclosure. Similar to focus, other parameters of the patterning process such as mask CDU, MSD, etc. may be altered to study the impact of the parameters. In an embodiment, an area A2 may have values of all the parameters (i.e., process variations) slightly outside their tolerance bands. The data from such A2 can also be used for model prediction. But there is also risk of having hotspots there. In an embodiment, the area A2 may be defined based on, for example, 2 out of 5 parameters are outside tolerance bands, 3 out of 5 are outside tolerance bands, and so on. Although the values of the parameters do not have least variation within the combined map, the parameter values may be useful for testing, model validation, or other similar applications.

Further, process P1106 involves obtaining, via a metrology tool, metrology data 1101 corresponding to the portion of the substrate. Process P1106 is also similar to process P86 discussed above, except that the data 1101 may be obtained from different specific locations (e.g., area A2) on the substrate. In an embodiment, obtaining the metrology data 1101 includes guiding the metrology tool to the portion of the substrate, and sampling, via the metrology tool, data at the portion (e.g., area A2) of the substrate.

Process P1108 involves processing the metrology data 1101 in a similar manner as discussed in process P88 earlier. For example, the processing involves image processing, determining an average of the metrology data of the portion of the substrate, and detecting and excluding outlier data from the metrology data.

Process P1109 involves validating, via simulation of a process model, model prediction accuracy 1110 based on the processed metrology data. The model prediction accuracy refer to comparing simulated output of the process model such as optics model, resist model, and etch model with the measured data (e.g., data 1101). For example, model prediction accuracy refers to accuracy of simulated contours on a wafer, CDs, resist profiles, etc. with respect to corresponding measured data of CDs, resist profiles, etc. In an embodiment, the simulated patterns may be compared with the metrology data to validate the prediction accuracy of a process model calibrated by using the method 800.

It can be understood by a person skilled in the art, that the present method 1100 is not limited to a particular process models and can be extended or modified for any process model of the patterning process that require metrology data, for example, for validating or testing the model predictions.

Figure 12:
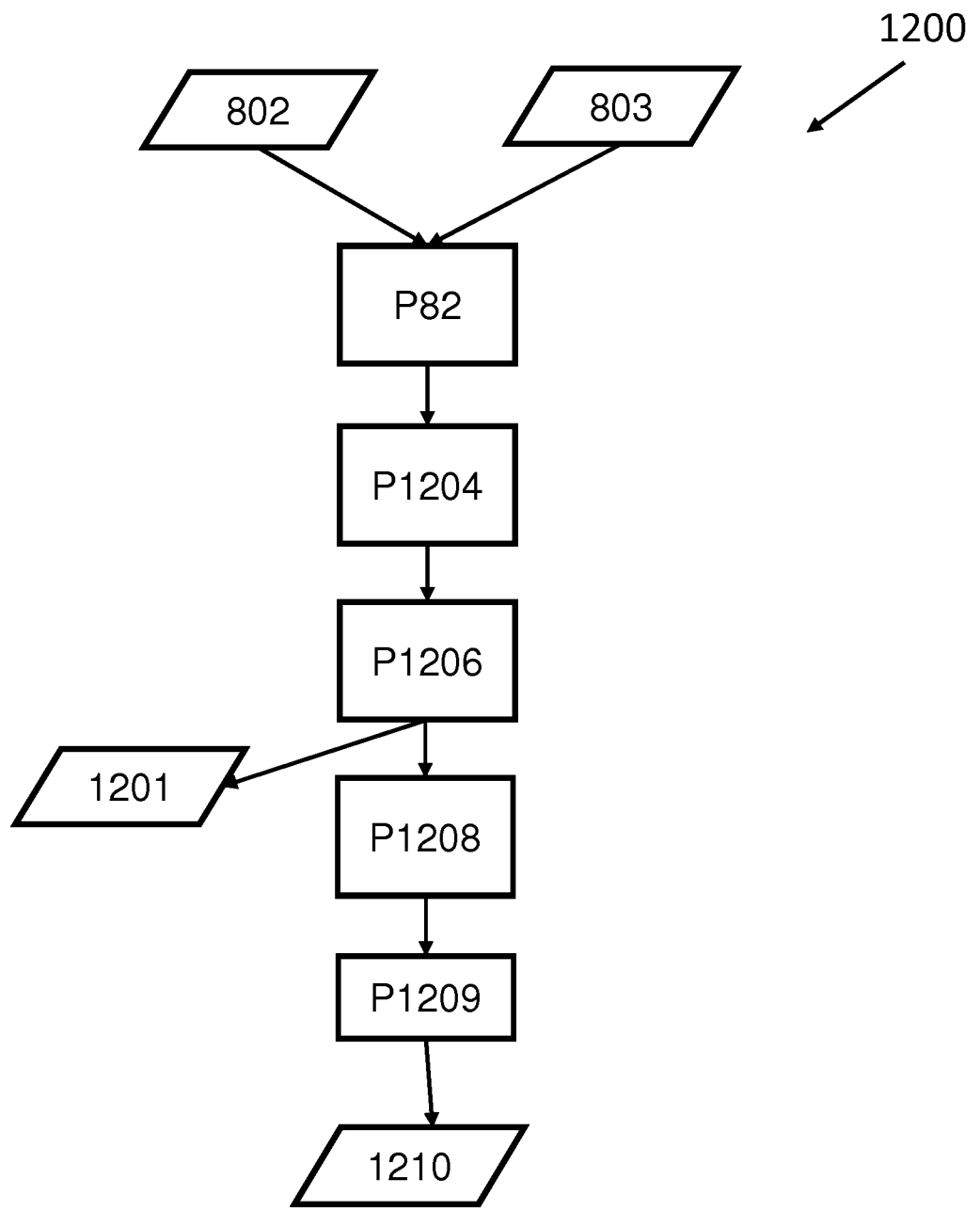
FIG. 12 describes method for hot spot detection according to an embodiment.

FIG. 12 describes method 1200 for determining (or detecting) hot spots of a patterning process. According to the present disclosure, hot spots referred to as "process window limiting patterns (PWLPs)."

Various patterns on or provided by a patterning device may have different process windows. i.e., a space of processing variables under which a pattern will be produced within specification (e.g., tolerance bands associated with parameters of the patterning process). Examples of pattern specifications that relate to potential systematic defects include checks for necking, line-end pull back, line thinning, CD, edge placement, overlapping, resist top loss, resist undercut and/or bridging. The process window of all the patterns on a patterning device or an area thereof may be obtained by merging (e.g., overlapping) process windows of each individual pattern. The boundary of the process window of all the patterns contains boundaries of process windows of some of the individual patterns. In other words, these individual patterns limit the process window of all the patterns. These patterns can be referred to as "hot spots" or "process window limiting patterns (PWLPs)," which are used interchangeably herein. When controlling a part of a patterning process, it is possible and economical to focus on the hot spots. When the hot spots are not defective, it is most likely that all the patterns are not defective.

The hot spots may be determined via simulation of the patterning process and/or measurements of defect related parameters (e.g., CD measurements) on an entire surface of the substrate. However, taking measurements on an entire substrate is impractical and highly time consuming (can take weeks or months to measure an entire surface), thus affecting yield of the patterning process. The present method allows selection of areas on a substrate that are likely to have hot spots and obtain metrology data within such areas, thus reducing metrology time and resources.

In an embodiment, the present method involves obtaining a plurality of process variation maps, and a combined process variation map of the plurality of process variation maps, as discussed earlier, in process P82.

Similar to the process P84, the method 1200, in process P1204 involves identifying a portion of the substrate that has values of one or more parameters of the patterning process greater than a hot spot threshold corresponding to the one or more parameters. The hot-spot threshold is a value of a parameter which if exceeded may most likely cause defects on the printed substrate. In an embodiment, each parameter (or process variable) may have a corresponding hot-spot threshold value. For example, a dose-related hot-spot threshold may be ±10%, a focus-related hot-spot threshold may be ±30 nm etc. In an embodiment, the hot-spot threshold value may be a combination of threshold values related to a plurality of parameters. For example, a "combinational" hot-spot threshold may be 6% dose, 25 nm focus, and 1 nm mask error. In an embodiment, the identified portion refers to area A3 (in FIG. 10), where values of the parameter within the combined map 803 are greater than a hot-spot threshold.

Further, process P1206 involves obtaining, via a metrology tool, metrology data 1201 corresponding to the portion of the substrate. Process P1206 is also similar to process P86 discussed above, except that the data 1201 may be obtained from different specific locations (e.g., area A3) on the substrate. In an embodiment, in process P1206, data may be obtained from area A3, as such areas have highest likelihood of causing a defect on the substrate. In an embodiment, obtaining the metrology data 1201 includes guiding the metrology tool to the portion of the substrate, and sampling, via the metrology tool, data at the portion (e.g, Area A3) of the substrate. In other words, the metrology data need not be collected within the areas A1 and/or A2, thus reducing metrology time and resources, and effectively reducing costs associated with metrology.

Process P1208 involves processing the metrology data 1201 in a similar manner as discussed in process P88 earlier. For example, the processing involves image processing, determining an average of the metrology data of the portion of the substrate, and detecting and excluding outlier data from the metrology data.

Process P1209, involves detecting hot spot locations 1210 on the substrate based on the processed metrology data. In an embodiment, detecting the hot spot locations involves performing a rule check on features at the portion of the substrate based on the metrology data and detecting a defective feature on the substrate corresponding to violation of the rule check. Examples of defects comprise closed contact holes, line-end pull back, resist line thinning/necking, contact hole bridging, etc.

As mentioned earlier, inspection of, e.g., semiconductor wafers is often done with optics-based sub-resolution tools (bright-field inspection). But, in some cases, certain features to be measured are too small to be effectively measured using bright-field inspection. For example, bright-field inspection of defects in features of a semiconductor device can be challenging. Moreover, as time progresses, features that are being made using patterning processes (e.g., semiconductor features made using lithography) are becoming smaller and in many cases, the density of features is also increasing. Accordingly, a higher resolution inspection technique is used and desired. An example inspection technique is electron beam inspection. Electron beam inspection involves focusing a beam of electrons on a small spot on the substrate to be inspected. An image is formed by providing relative movement between the beam and the substrate (hereinafter referred to as scanning the electron beam) over the area of the substrate inspected and collecting secondary and/or backscattered electrons with an electron detector. The image data is then processed to, for example, identify defects.

So, in an embodiment, the inspection apparatus may be an electron beam inspection apparatus (e.g., the same as or similar to a scanning electron microscope (SEM)) that yields an image of a structure (e.g., some or all the structure of a device, such as an integrated circuit) exposed or transferred on the substrate.

Figure 13:
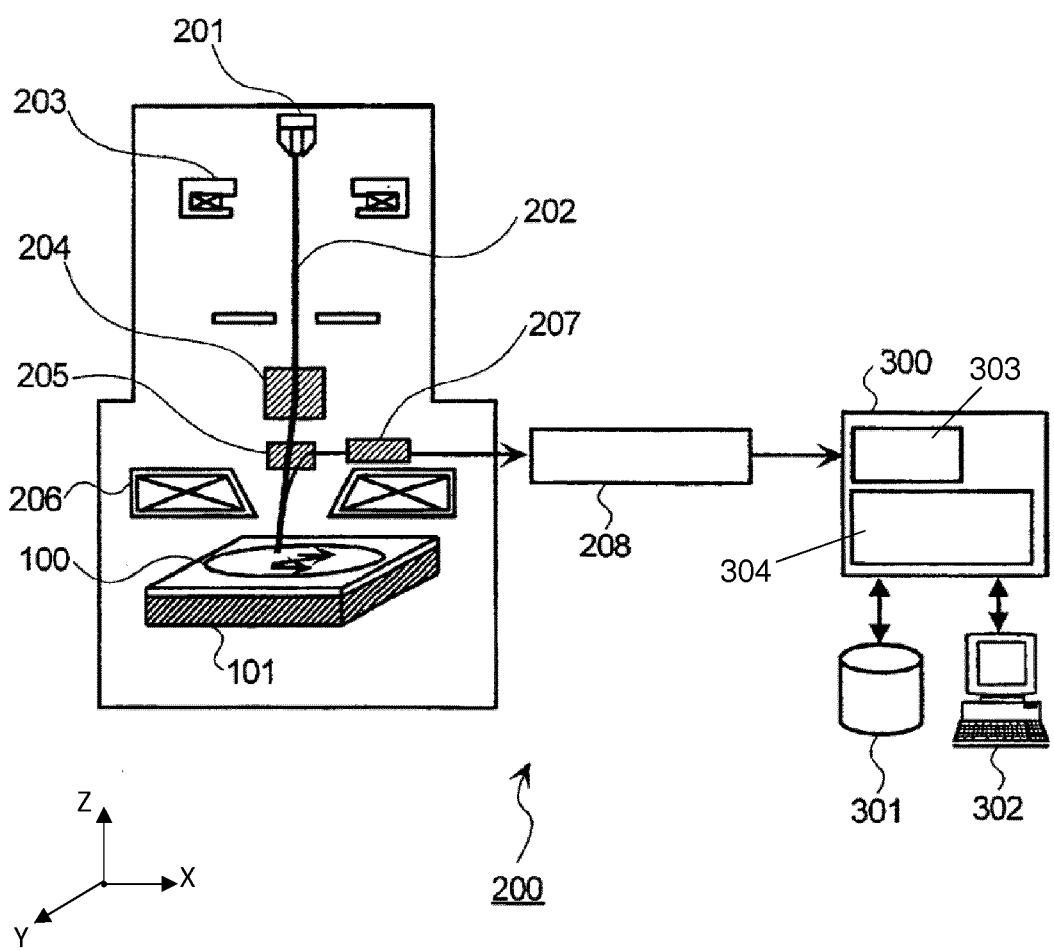
FIG. 13 schematically depicts an embodiment of a scanning electron microscope (SEM), according to an embodiment.

FIG. 13 schematically depicts an embodiment of an electron beam inspection apparatus 200. A primary electron beam 202 emitted from an electron source 201 is converged by condenser lens 203 and then passes through a beam deflector 204, an E×B deflector 205, and an objective lens 206 to irradiate a substrate 100 on a substrate table 101 at a focus.

When the substrate 100 is irradiated with electron beam 202, secondary electrons are generated from the substrate 100. The secondary electrons are deflected by the E×B deflector 205 and detected by a secondary electron detector 207. A two-dimensional electron beam image can be obtained by detecting the electrons generated from the sample in synchronization with, e.g., two dimensional scanning of the electron beam by beam deflector 204 or with repetitive scanning of electron beam 202 by beam deflector 204 in an X or Y direction, together with continuous movement of the substrate 100 by the substrate table 101 in the other of the X or Y direction. Thus, in an embodiment, the electron beam inspection apparatus has a field of view for the electron beam defined by the angular range into which the electron beam can be provided by the electron beam inspection apparatus (e.g., the angular range through which the deflector 204 can provide the electron beam 202). Thus, the spatial extent of the field of the view is the spatial extent to which the angular range of the electron beam can impinge on a surface (wherein the surface can be stationary or can move with respect to the field).

A signal detected by secondary electron detector 207 is converted to a digital signal by an analog/digital (A/D) converter 208, and the digital signal is sent to an image processing system 300. In an embodiment, the image processing system 300 may have memory 303 to store all or part of digital images for processing by a processing unit 304. The processing unit 304 (e.g., specially designed hardware or a combination of hardware and software or a computer readable medium comprising software) is configured to convert or process the digital images into datasets representative of the digital images. In an embodiment, the processing unit 304 is configured or programmed to cause execution of a method described herein. Further, image processing system 300 may have a storage medium 301 configured to store the digital images and corresponding datasets in a reference database. A display device 302 may be connected with the image processing system 300, so that an operator can conduct necessary operation of the equipment with the help of a graphical user interface.

Figure 14:
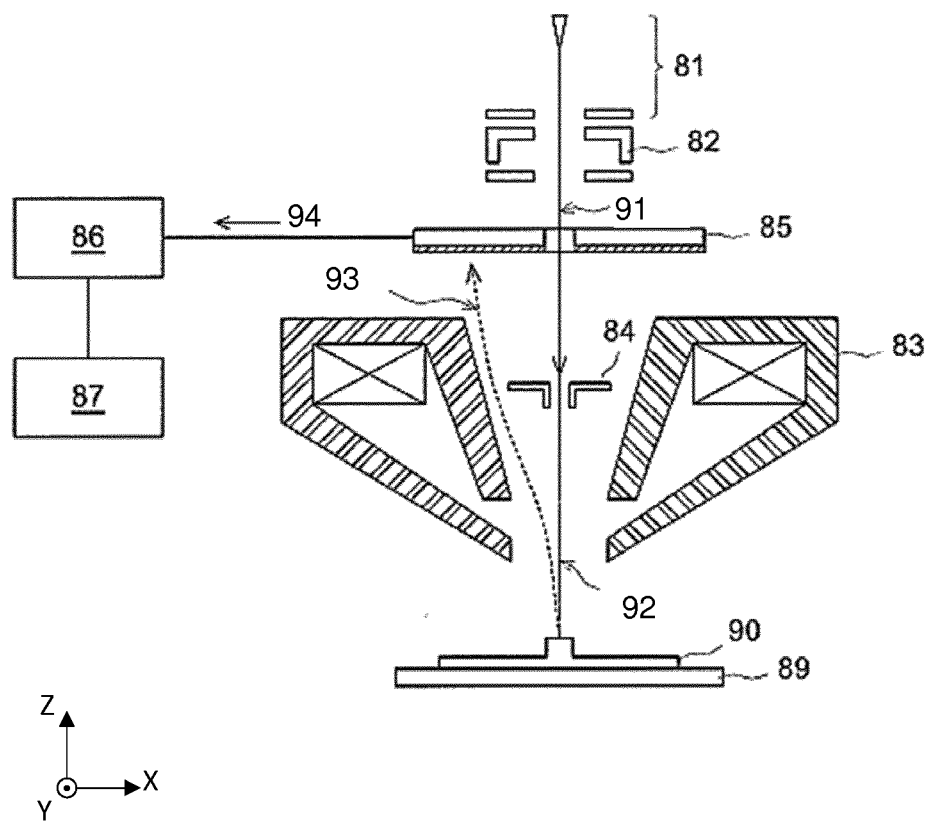
FIG. 14 schematically depicts an embodiment of an electron beam inspection apparatus, according to an embodiment.

FIG. 14 schematically illustrates a further embodiment of an inspection apparatus. The system is used to inspect a sample 90 (such as a substrate) on a sample stage 89 and comprises a charged particle beam generator 81, a condenser lens module 82, a probe forming objective lens module 83, a charged particle beam deflection module 84, a secondary charged particle detector module 85, and an image forming module 86.

The charged particle beam generator 81 generates a primary charged particle beam 91. The condenser lens module 82 condenses the generated primary charged particle beam 91. The probe forming objective lens module 83 focuses the condensed primary charged particle beam into a charged particle beam probe 92. The charged particle beam deflection module 84 scans the formed charged particle beam probe 92 across the surface of an area of interest on the sample 90 secured on the sample stage 89. In an embodiment, the charged particle beam generator 81, the condenser lens module 82 and the probe forming objective lens module 83, or their equivalent designs, alternatives or any combination thereof, together form a charged particle beam probe generator which generates the scanning charged particle beam probe 92.

The secondary charged particle detector module 85 detects secondary charged particles 93 emitted from the sample surface (maybe also along with other reflected or scattered charged particles from the sample surface) upon being bombarded by the charged particle beam probe 92 to generate a secondary charged particle detection signal 94. The image forming module 86 (e.g., a computing device) is coupled with the secondary charged particle detector module 85 to receive the secondary charged particle detection signal 94 from the secondary charged particle detector module 85 and accordingly forming at least one scanned image. In an embodiment, the secondary charged particle detector module 85 and image forming module 86, or their equivalent designs, alternatives or any combination thereof, together form an image forming apparatus which forms a scanned image from detected secondary charged particles emitted from sample 90 being bombarded by the charged particle beam probe 92.

In an embodiment, a monitoring module 87 is coupled to the image forming module 86 of the image forming apparatus to monitor, control, etc. the patterning process and/or derive a parameter for patterning process design, control, monitoring, etc. using the scanned image of the sample 90 received from image forming module 86. So, in an embodiment, the monitoring module 87 is configured or programmed to cause execution of a method described herein. In an embodiment, the monitoring module 87 comprises a computing device. In an embodiment, the monitoring module 87 comprises a computer program to provide functionality herein and encoded on a computer readable medium forming, or disposed within, the monitoring module 87.

In an embodiment, like the electron beam inspection tool of FIG. 13 that uses a probe to inspect a substrate, the electron current in the system of FIG. 14 is significantly larger compared to, e.g., a CD SEM such as depicted in FIG. 13, such that the probe spot is large enough so that the inspection speed can be fast. However, the resolution may not be as high as compared to a CD SEM because of the large probe spot. In an embodiment, the above discussed inspection apparatus (in FIG. 13 or 14) may be single beam or a multi-beam apparatus without limiting the scope of the present disclosure.

The SEM images, from, e.g., the system of FIG. 13 and/or FIG. 14, may be processed to extract contours that describe the edges of objects, representing device structures, in the image. These contours are then typically quantified via metrics, such as CD, at user-defined cut-lines. Thus, typically, the images of device structures are compared and quantified via metrics, such as an edge-to-edge distance (CD) measured on extracted contours or simple pixel differences between images.

Figure 15:
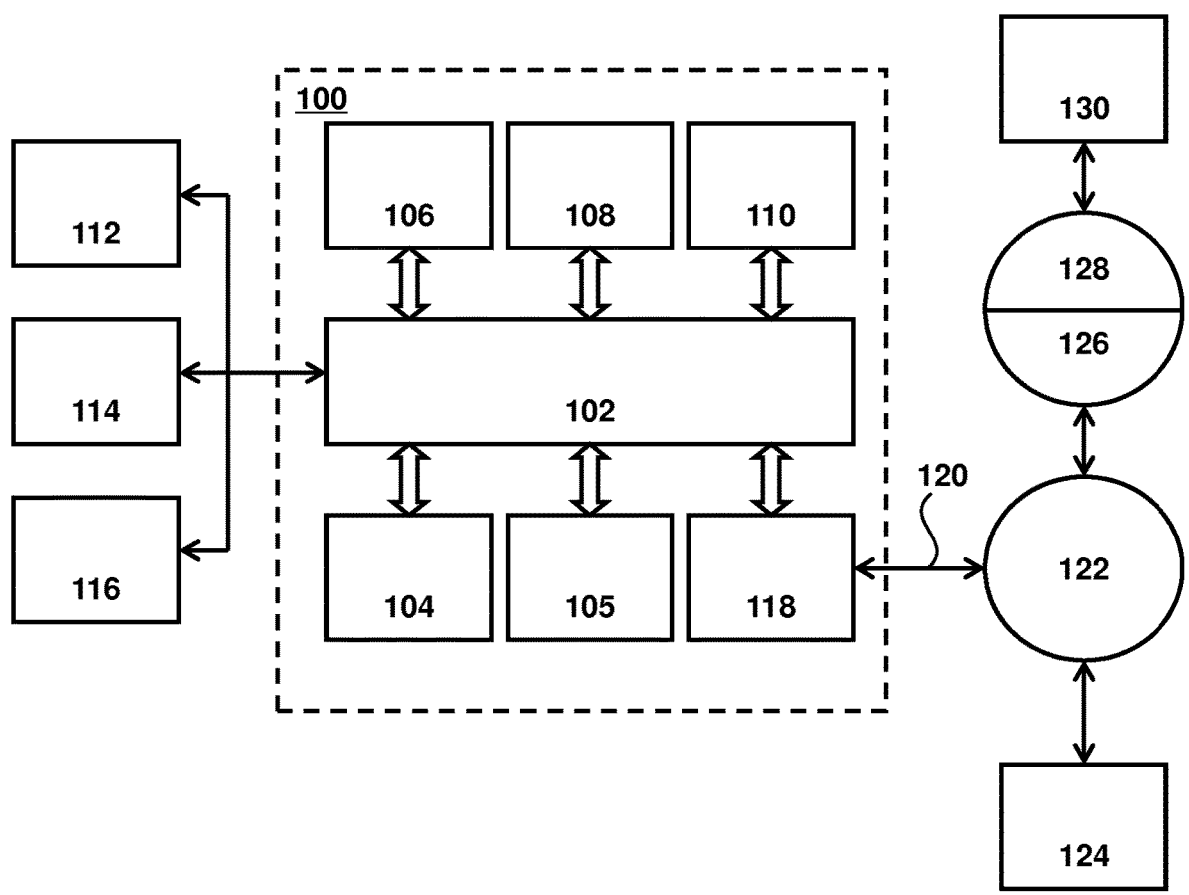
FIG. 15 is a block diagram of an example computer system according to an embodiment.

FIG. 15 is a block diagram that illustrates a computer system 100 which can assist in implementing the optimization methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of a process described herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions. Thus, embodiments are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with one or more embodiments, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 16:
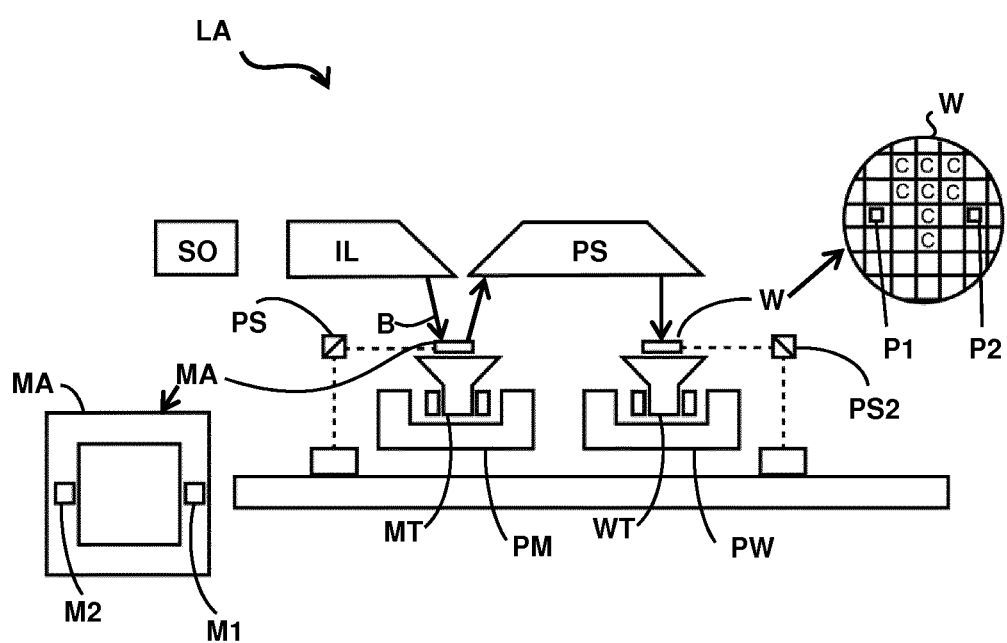
FIG. 16 is a schematic diagram of another lithographic projection apparatus according to an embodiment

FIG. 16 schematically depicts another exemplary lithographic projection apparatus LA that includes:
- a source collector module SO to provide radiation.
- an illumination system (illuminator) IL configured to condition a radiation beam B (e.g. EUV radiation) from the source collector module SO.
- a support structure (e.g. a mask table) MT constructed to support a patterning device (e.g. a mask or a reticle) MA and connected to a first positioner PM configured to accurately position the patterning device;
- a substrate table (e.g. a wafer table) WT constructed to hold a substrate (e.g. a resist coated wafer) W and connected to a second positioner PW configured to accurately position the substrate; and
- a projection system (e.g. a reflective projection system) PS configured to project a pattern imparted to the radiation beam B by patterning device MA onto a target portion C (e.g. comprising one or more dies) of the substrate W.

As here depicted, the apparatus LA is of a reflective type (e.g. employing a reflective mask). It is to be noted that because most materials are absorptive within the EUV wavelength range, the patterning device may have multi-layer reflectors comprising, for example, a multi-layer stack of molybdenum and silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 16, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 16, for providing the laser beam exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the radiation source may be an integral part of the source collector module, for example when the radiation source is a discharge produced plasma EUV generator, often termed as a DPP radiation source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus LA could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 17:
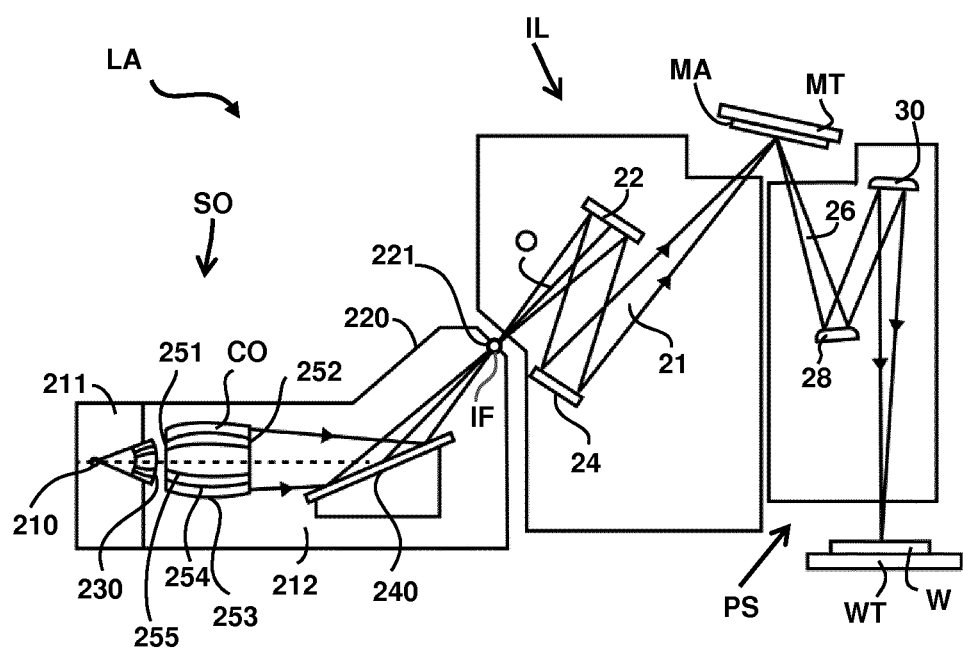
FIG. 17 is a more detailed view of the apparatus in FIG. 16 according to an embodiment.

FIG. 17 shows the apparatus LA in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma radiation source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 17.

Collector optic CO, as illustrated in FIG. 17, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is desirably used in combination with a discharge produced plasma radiation source.

Figure 18:
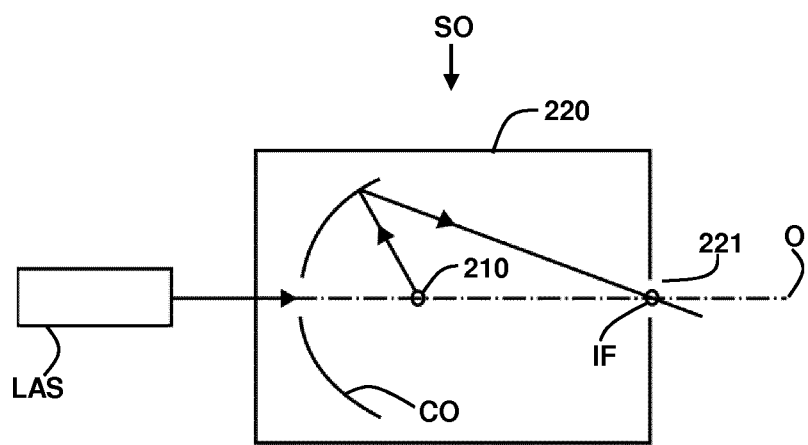
FIG. 18 is a more detailed view of the source collector module of the apparatus of FIG. 16 and FIG. 17 according to an embodiment.

Alternatively, the source collector module SO may be part of an LPP radiation system as shown in FIG. 18. A laser LAS is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The embodiments may further be described using the following clauses:

1. A method for calibrating a process model of a patterning process, the method comprising:
   identifying, via a processor, a portion of the substrate that has values within a tolerance band of one or more parameters of the patterning process;
   obtaining, via a metrology tool, metrology data corresponding to the portion of the substrate;
   processing, via the processor, the metrology data; and
   calibrating, via the processor, a process model based on the processed metrology data.

2. The method of clause 1, wherein the identifying step further comprises:
   obtaining a plurality of process variations, and a combined process variation of the plurality of process variations; and
   identifying the portion of the substrate that has values within the tolerance band of one or more parameters of the patterning process based the combined process variation.

3. The method of clause 2, wherein a process variation of the plurality of process variations or the combined process variation is a map of the substrate, wherein the map is a distribution of values of a process variable across the substrate.

4. The method of any of clauses 2-3, wherein the plurality of process variations comprises one or more variations in dose, focus, critical dimension (CD), overlay, and/or edge placement error.

5. The method of any of clauses 1-4, wherein the obtaining the metrology data comprises:
   guiding, via the processor, the metrology tool to the portion of the substrate; and
   sampling, via the metrology tool, data at the portion of the substrate.

6. The method of any of clauses 1-5, wherein the metrology data comprises an image of a printed substrate, and/or values of a parameter of the patterning process.

7. The method of any of clauses 1-6, wherein a parameter of the patterning process is a critical dimension, an edge placement error, and/or an overlay.

8. The method of any of clauses 1-7, wherein the metrology data is a scanning electron microscope image.

9. The method of any of clauses 1-8, wherein the process model is an optical proximity correction model.

10. The method of any of clauses 1-9, wherein the portion of the substrate has least systematic variations in the one or more parameters.

11. The method of any of clauses 1-10, wherein the processing the metrology data comprises at least one of:
    image processing;
    determining an average of the metrology data of the portion of the substrate; and
    detecting and excluding outlier data from the metrology data.

12. The method of any of clauses 1-11, further comprising obtaining values of a plurality of parameters of the patterning process; and selecting, via the metrology tool, metrology data such that each parameter of the plurality of parameters is within or below the respective tolerance band of the plurality of parameters.

13. A method of validating model prediction accuracy for a patterning process, the method comprising:
    identifying, via a processor, a portion of the substrate that has values of at least one parameter of one or more parameters of the patterning process outside a respective tolerance band of the one or more parameters;
    obtaining, via a metrology tool, metrology data corresponding to the portion of the substrate;
    processing, via the processor, the metrology data; and
    validating, via simulation of a process model, model prediction accuracy based on comparison between simulated data of the process model and the processed metrology data.

14. The method of clause 13, wherein the obtaining the metrology data comprises:
    guiding, via the processor, the metrology tool to the portion of the substrate; and
    sampling, via the metrology tool, data at the portion of the substrate.

15. The method of any of clauses 13-14, wherein the processing the metrology data comprises at least one of:
    image processing;
    determining an average of the metrology data of the portion of the substrate; and
    detecting and excluding outlier data from the metrology data.

16. The method of any of clauses 13-15, wherein the model prediction includes contours, critical dimension (CD), and/or resist profile.

17. The method of any of clauses 13-16, wherein the one or more parameters includes focus, mask CD, dose, and/or MSD.

18. The method of clause 13, wherein the identifying step further comprises:
    obtaining a plurality of process variations, and a combined process variation of the plurality of process variations; and
    identifying the portion of the substrate that has values of at least one parameter of one or more parameters of the patterning process outside a respective tolerance band of the one or more parameters.

19. The method of clause 18, wherein a process variation of the plurality of the process variations or the combined process variation is represented as a map of the substrate, wherein the map is a distribution of values of a process variable across the substrate.

20. A method for determining hot spots of a patterning process, the method comprising:
    identifying, via a processor, a portion of the substrate that has values of one or more parameters of the patterning process greater than a hot spot threshold corresponding to the one or more parameters;
    obtaining, via a metrology tool, metrology data corresponding to the portion of the substrate;
    processing, via the processor, the metrology data; and
    detecting, via the processor, hot spot locations on the substrate based on the processed metrology data.

21. The method of clause 20, wherein the detecting the hot spot locations comprises:
    performing a rule check on features at the portion of the substrate based on the metrology data; and
    detecting a defective feature on the substrate corresponding to violation of the rule check.

22. The method of any of clauses 20-21, wherein the obtaining the metrology data comprises:
    guiding, via the processor, the metrology tool to the portion of the substrate; and
    sampling, via the metrology tool, data at the portion of the substrate.

23. The method of any of clauses 20-22, wherein the processing the metrology data comprises at least one of:
    image processing;
    determining an average of the metrology data of the portion of the substrate; and
    detecting and excluding outlier data from the metrology data.

24. The method of any of clauses 20-23, further comprising:
    determining, via simulation of a process model, pattern sensitivity of the patterns within the portion of the substrate to a given process variation; and
    ranking a set of patterns based on the pattern sensitivity.

25. The method of any of clauses 20-23, further comprising:
    determining, via simulation of the process model, image contrast and image log-slope of the patterns within the portion of the substrate; and
    locating patterns within the portion of the substrate having relatively higher likelihood of stochastic failure based on the image contrast and the image log-slope.

26. The method of any of clauses 20-25, wherein the identifying step further comprises:
    obtaining a plurality of process variations, and a combined process variation of the plurality of process variations; and
    identifying the portion of the substrate that has values of one or more parameters of the patterning process greater than a hot spot threshold corresponding to the one or more parameters.

27. The method of clause 26, wherein a process variation of the plurality of the process variations or the combined process variation is represented as a map of the substrate, wherein the map is a distribution of values of a process variable across the substrate.

28. A computer program product comprising a non-transitory computer readable medium having instructions recorded thereon, the instructions when executed by a computer implementing the method of any of clauses 1-27.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include DUV (deep ultra violet) lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Although specific reference may be made in this text to the use of embodiments in the manufacture of ICs, it should be understood that the embodiments herein may have many other possible applications. For example, it may be employed in the manufacture of integrated optical systems, guidance and detection patterns for magnetic domain memories, liquid-crystal displays (LCDs), thin film magnetic heads, micromechanical systems (MEMs), etc. The skilled artisan will appreciate that, in the context of such alternative applications, any use of the terms "reticle", "wafer" or "die" herein may be considered as synonymous or interchangeable with the more general terms "patterning device", "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create, for example, a multi-layer IC, so that the term substrate used herein may also refer to a substrate that already contains multiple processed layers.

In the present document, the terms "radiation" and "beam" as used herein encompass all types of electromagnetic radiation, including ultraviolet radiation (e.g. with a wavelength of about 365, about 248, about 193, about 157 or about 126 nm) and extreme ultra-violet (EUV) radiation (e.g. having a wavelength in the range of 5-20 nm), as well as particle beams, such as ion beams or electron beams.

The terms "optimizing" and "optimization" as used herein refers to or means adjusting a patterning apparatus (e.g., a lithography apparatus), a patterning process, etc. such that results and/or processes have more desirable characteristics, such as higher accuracy of projection of a design pattern on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

Aspects of the invention can be implemented in any convenient form. For example, an embodiment may be implemented by one or more appropriate computer programs which may be carried on an appropriate carrier medium which may be a tangible carrier medium (e.g. a disk) or an intangible carrier medium (e.g. a communications signal). Embodiments of the invention may be implemented using suitable apparatus which may specifically take the form of a programmable computer running a computer program arranged to implement a method as described herein. Thus, embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, these inventions have been grouped into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary sections of the present document should be taken as containing a comprehensive listing of all such inventions or all aspects of such inventions.

It should be understood that the description and the drawings are not intended to limit the present disclosure to the particular form disclosed, but to the contrary, the intention is to cover all modifications, equivalents, and alternatives falling within the spirit and scope of the inventions as defined by the appended claims.

Modifications and alternative embodiments of various aspects of the inventions will be apparent to those skilled in the art in view of this description. Accordingly, this description and the drawings are to be construed as illustrative only and are for the purpose of teaching those skilled in the art the general manner of carrying out the inventions. It is to be understood that the forms of the inventions shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every. References to selection from a range includes the end points of the range.

In the above description, any processes, descriptions or blocks in flowcharts should be understood as representing modules, segments or portions of code which include one or more executable instructions for implementing specific logical functions or steps in the process, and alternate implementations are included within the scope of the exemplary embodiments of the present advancements in which functions can be executed out of order from that shown or discussed, including substantially concurrently or in reverse order, depending upon the functionality involved, as would be understood by those skilled in the art.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

While certain embodiments have been described, these embodiments have been presented by way of example only, and are not intended to limit the scope of the present disclosures. Indeed, the novel methods, apparatuses and systems described herein can be embodied in a variety of other forms; furthermore, various omissions, substitutions and changes in the form of the methods, apparatuses and systems described herein can be made without departing from the spirit of the present disclosures. The accompanying claims and their equivalents are intended to cover such forms or modifications as would fall within the scope and spirit of the present disclosures.

What is claimed is:

1. A method comprising:
    obtaining a combined process variation corresponding to a combination of different sets of data representing a plurality of process variations, at least one set of the different sets obtained using a different measurement technique or representing a different parameter than another set of the different sets;
    identifying, via a processor system, a portion of a substrate that has values within a tolerance band of one or more parameters of a patterning process based on the combined process variation;
    accessing metrology data corresponding to the portion of the substrate, wherein the metrology data is obtained via a metrology tool; and
    calibrating, via the processor, a computer process model based on the metrology data.

2. The method of claim 1, wherein the combined process variation is a map of the substrate, wherein the map is a distribution of process variable values across the substrate.

3. The method of claim 1, wherein the plurality of process variations comprises one or more variations in dose, focus, critical dimension (CD), overlay, and/or edge placement error.

4. The method of claim 1, wherein the accessing the metrology data comprises:

guiding the metrology tool to the portion of the substrate; and sampling, via the metrology tool, data at the portion of the substrate.

5. The method of claim 1, wherein the metrology data comprises an image of a printed substrate, and/or values of a parameter of the patterning process.

6. The method of claim 1, wherein a parameter of the patterning process is a critical dimension, an edge placement error, and/or an overlay.

7. The method of claim 1, wherein the metrology data is a scanning electron microscope image.

8. The method of claim 1, wherein the process model is an optical proximity correction model.

9. The method of claim 1, wherein the portion of the substrate has least systematic variations in the one or more parameters.

10. The method of claim 1, further comprising processing the metrology data by at least one selected from:

image processing;

determining an average of the metrology data of the portion of the substrate; and/or detecting and excluding outlier data from the metrology data.

11. The method of claim 1, further comprising:

obtaining values of a plurality of parameters of the patterning process; and selecting, via the metrology tool, metrology data such that each parameter of the plurality of parameters is within or below the respective tolerance band of the plurality of parameters.

12. The method of claim 1, further comprising:

employing the calibrated process model in a patterning process simulation; and validating, via simulation using the process model, model prediction accuracy based on comparison between simulated data of the process model and the metrology data.

13. A computer program product comprising a non-transitory computer readable medium having instructions therein, the instructions, when executed by a computer system, configured to cause the computer system to at least:

obtain a combined process variation corresponding to a combination of different sets of data representing a plurality of process variations, at least one set of the different sets corresponding to a different measurement technique or representing a different parameter than another set of the different sets;

identify a portion of a substrate that has values within a tolerance band of one or more parameters of a patterning process based on the combined process variation;

access metrology data corresponding to the portion of the substrate, wherein the metrology data is obtained via a metrology tool; and calibrate a computer process model based on the metrology data.

14. The computer program product of claim 13, wherein the combined process variation is a map of the substrate, wherein the map is a distribution of process variable values across the substrate.

15. The computer program product of claim 13, wherein the instructions configured to cause the computer to access the metrology data are further configured to cause the computer system to:

guide the metrology tool to the portion of the substrate; and enable sampling, via the metrology tool, data at the portion of the substrate.

16. The computer program product of claim 13, wherein the instructions are further configured to cause the computer system to process the metrology data by at least one selected from:

image processing;

determining an average of the metrology data of the portion of the substrate; and/or detecting and excluding outlier data from the metrology data.

17. The computer program product of claim 13, wherein the instructions are further configured to cause the computer system to:

obtain values of a plurality of parameters of the patterning process; and select, via the metrology tool, metrology data such that each parameter of the plurality of parameters is within or below the respective tolerance band of the plurality of parameters.

18. The computer program product of claim 13, wherein the instructions are further configured to cause the computer system to:

employ the calibrated process model in a patterning process simulation; and validate, via simulation using the process model, model prediction accuracy based on comparison between simulated data of the process model and the metrology data.

19. The computer program product of claim 13, wherein the plurality of process variations comprises one or more variations in dose, focus, critical dimension (CD), overlay, and/or edge placement error.

20. The computer program product of claim 13, wherein the process model is an optical proximity correction model.

* * * * *